(12) United States Patent
Corhodzic et al.

(10) Patent No.: US 7,646,590 B1
(45) Date of Patent: Jan. 12, 2010

(54) DATA CENTER POWER DISTRIBUTION

(75) Inventors: Selver Corhodzic, Santa Clara, CA (US); Andrew Carlson, Atherton, CA (US); Montgomery Sykora, Denver, CO (US); Winnie Leung, Mountain View, CA (US); Jonathan D. Beck, Mountain View, CA (US); Alan Lam, Fremont, CA (US); Jimmy Clidaras, Los Altos, CA (US); William Hamburgen, Palo Alto, CA (US)

(73) Assignee: Exaflop LLC, Mountain View, CA (US)

( * ) Notice: Subject to any disclaimer, the term of this patent is extended or adjusted under 35 U.S.C. 154(b) by 0 days.

(21) Appl. No.: 11/774,447

(22) Filed: Jul. 6, 2007

(51) Int. Cl.
   *H02B 1/26* (2006.01)

(52) U.S. Cl. ................. 361/641; 361/622; 361/642; 361/644; 361/727

(58) Field of Classification Search ............. None
   See application file for complete search history.

(56) References Cited

U.S. PATENT DOCUMENTS

| | | | |
|---|---|---|---|
| 3,949,277 A * | 4/1976 | Yosset ................. 361/686 |
| 5,216,579 A * | 6/1993 | Basara et al. ............. 361/683 |
| 6,045,399 A | 4/2000 | Yu | |
| 6,301,095 B1 * | 10/2001 | Laughlin et al. ............ 361/624 |
| 6,410,994 B1 | 6/2002 | Jones et al. | |
| 6,573,617 B2 | 6/2003 | Jones et al. | |
| 6,586,849 B2 | 7/2003 | Tarr | |
| 6,731,507 B2 * | 5/2004 | Varghese et al. ............ 361/725 |
| 6,744,150 B2 | 6/2004 | Rendic | |
| 6,806,420 B2 * | 10/2004 | Schomaker et al. ........... 174/50 |
| 6,826,036 B2 * | 11/2004 | Pereira ................... 361/624 |
| 6,836,030 B2 * | 12/2004 | Smith et al. .............. 307/147 |
| 6,862,187 B2 * | 3/2005 | Robbins et al. ............ 361/725 |
| 6,882,530 B2 * | 4/2005 | Cyphers et al. ............ 361/686 |
| 6,937,461 B1 * | 8/2005 | Donahue, IV ............... 361/622 |
| 6,991,495 B1 | 1/2006 | Aromin | |
| 7,116,550 B2 * | 10/2006 | Ewing et al. .............. 361/623 |
| 7,196,900 B2 * | 3/2007 | Ewing et al. .............. 361/642 |
| 7,394,667 B2 * | 7/2008 | Kelly et al. .............. 361/823 |
| 2001/0026436 A1 * | 10/2001 | Tanzer et al. ............. 361/610 |
| 2004/0231875 A1 * | 11/2004 | Rasmussen et al. ........... 174/50 |
| 2005/0286184 A1 | 12/2005 | Campolo | |

* cited by examiner

*Primary Examiner*—Boris L Chervinsky
(74) *Attorney, Agent, or Firm*—Fish & Richardson P.C.

(57) ABSTRACT

A power distribution apparatus includes a housing holding a plurality of electrical outlets, a plurality of independent electrical circuits within the housing, and a plurality of cord sets serving the plurality of independent electrical circuits and extending from the housing.

27 Claims, 17 Drawing Sheets

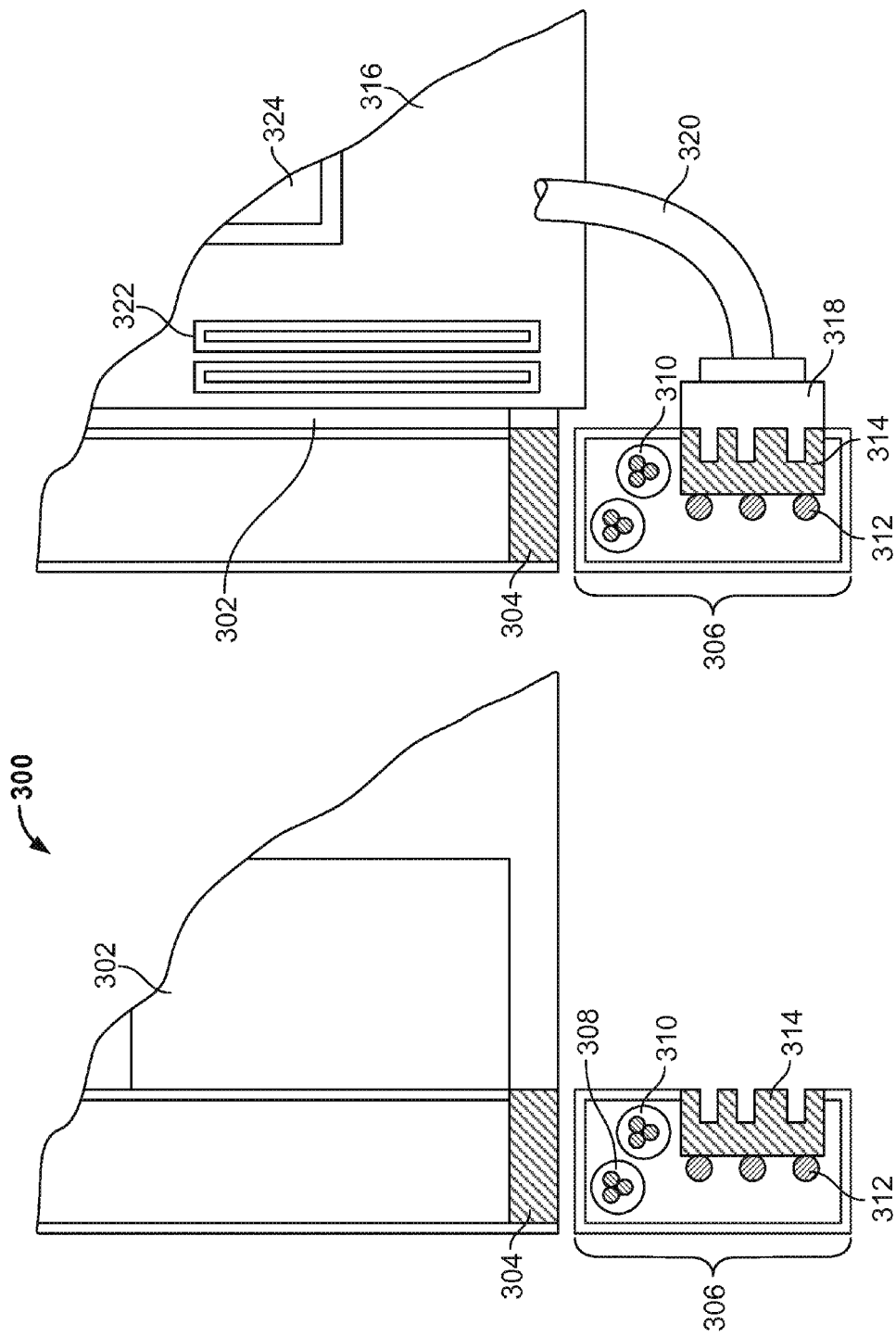

DATA CENTER POWER DISTRIBUTION

TECHNICAL FIELD

This document relates to systems and techniques for distributing power to electrical equipment, such as computer server racks and associated cooling equipment.

BACKGROUND

Electricity does us little good if we cannot get it to where it is needed. Electrical distribution systems do just that—move newly-formed electricity from a central point of generation, such as in a power plant, and out to various users of the electricity, such as homes and businesses. After the electricity is initially stepped up in voltage (so that more energy can be carried on main power lines), the voltage is gradually stepped down as the electricity gets closer to its point of use.

Electrical distribution inside a facility involves getting the electricity from an entry point to one or more electrical loads in the building. When there are multiple loads, the electrical supply needs to be split up. Such is the case with a data center, such as a server farm, that contains hundreds or thousands of computers. Each computer includes electrical loads, and power coming into the data center needs to be distributed properly to each of the computers.

SUMMARY

This document describes systems and methods that may be employed to distribute power within a facility such as a large data center. Power may initially be distributed via bus bars having taps that lead to various boxes containing circuit breakers, switches, and fuses that lead to various boxes that accommodate connect/disconnect electrical plugs. Non-standard and standard flexible cords may lead from the plugs down to power strips located adjacent to motherboards in a number of racks. Each of the power strips may serve more devices than could be provided by a single cord, so that multiple cords may lead to each power strip. Inside the strip, the cords may be associated with particular power circuits which each may serve a subset of the electrical outlets provided in the power strips. The power strip may be attached to a computer server rack, and the outlets may be arranged along the power strip to generally align with motherboard that are mounted in the rack.

The power distribution boxes may be mounted to hang above the computer racks (or above work areas between rows of racks), so that the cords run downward from the boxes to the power strips. The boxes may also be located below the racks, such as under a raised floor. Each power distribution box may contain a number of outlets that match to a number of cords needed within a particular length of a row of data center racks, such as approximately 9 to 12 outlets. The number of outlets per box may be selected to meet a maximum cord length requirement also.

Other power distribution boxes may be arranged in a similar manner and may provide power to ancillary support mechanisms distributed in a data center, such as circulation fans and networking equipment. Such other boxes may be physically arranged in a manner similar to boxes providing power to computers in the datacenter, so as to provide generally parallel distribution networks. The other power distribution system may connect to the same bus bars as the computer-supply power system, or may be more isolated from such other system. Other arrangements and features of electrical distribution apparatuses and system may also be provide and used in various manners, such as power monitoring and transient voltage surge suppression (TVSS).

In one implementation, an apparatus is disclosed that comprises a housing holding a plurality of electrical outlets, a plurality of independent electrical circuits within the housing, and a plurality of cord sets serving the plurality of independent electrical circuits and extending from the housing. Each of the plurality of cord sets can serve one of the plurality of independent electrical circuits. The electrical outlets can be positioned in one or more substantially linear arrangements. The electrical outlets can be spaced from each other to correspond to motherboards in a rack-mount computer system. The apparatus can also comprise a fuse socket in the housing associated with each of the independent electrical circuits. Moreover, the apparatus can include conductors associated with each of the independent circuits, wherein the conductors are uninsulated along a substantial length corresponding to outlets served by the conductors. The conductors can be fixedly joined to the electrical outlets. Also, a first independent electrical circuit can serve a first plurality of contiguous electrical outlets and a second electrical circuit can serve a second plurality of contiguous electrical outlets.

In some aspects, the apparatus further comprises an electrical distribution box having a plurality of outlets, wherein each of the plurality of outlets is associated with one of the plurality of cord sets. The electrical distribution box can receive three-phase power and supply single-phase power. Also, the plurality of cords sets is each less than about fifteen feet in length.

In another implementation, a power distribution apparatus is disclosed. The apparatus includes a plurality of electrical outlets arranged in a substantially linear array, a plurality of electrical circuits in a common housing, wherein each electrical circuit serves one or more of the plurality of electrical outlets, and a plurality of cord sets, wherein each cord set is connected to one of the plurality of electrical circuits. Also, each of the plurality of cord sets can serve one of the plurality of electrical circuits. The apparatus can further comprise conductors associated with each of the electrical circuits, wherein the conductors are uninsulated along a substantial length corresponding to outlets served by the conductors. A first electrical circuit can serve a first plurality of contiguous electrical outlets and a second electrical circuit can serve a second plurality of contiguous electrical outlets. The apparatus also can include an electrical distribution box having a plurality of outlets, wherein each of the plurality of outlets is associated with one of the plurality of cord sets.

In another implementation, a data center electrical distribution system is disclosed. The system comprises a bus tap configured to connect to an electrical bus, a conductor attached at a first end to the bus tap, an electrical distribution box attached to a second end of the conductor, and a plurality of cords each extending from the electrical distribution box to power strips for rack-mounted computers. Each power strip can receive three separate cords. Also, the power strips can be positioned along vertical front edges of data center computer racks.

In yet another implementation, a data center electrical distribution system is disclosed that includes an electrical bus bar a first plurality of electrical distribution boxes electrically connected to the bus bar, each of the first plurality of electrical distribution boxes including a plurality of outlets for connecting to cord sets for powering computer units, and a second plurality of electrical distribution boxes electrically connected to the bus bar, each of the second plurality of electrical distribution boxes including a plurality of outlets for connecting to cord sets for powering mechanical services associated with the computer units.

In another implementation, a method is disclosed that includes electrically connecting a plurality of rack-mounted computers to a rack-mounted power strip having a plurality of input power cords, positioning a rack holding the rack-mounted computers near an electrical distribution box, electrically connecting the plurality of input power cords to the electrical distribution box, and powering the electrical distribution box.

The details of one or more embodiments are set forth in the accompanying drawings and the description below. Other features, objects, and advantages will be apparent from the description and drawings, and from the claims.

DESCRIPTION OF DRAWINGS

FIG. 3A shows a top view of a front corner of a computer bay, showing an electrical power strip.

FIG. 3B shows the view from FIG. 3A, with a computer board inserted into the bay.

DETAILED DESCRIPTION

Figure 1:
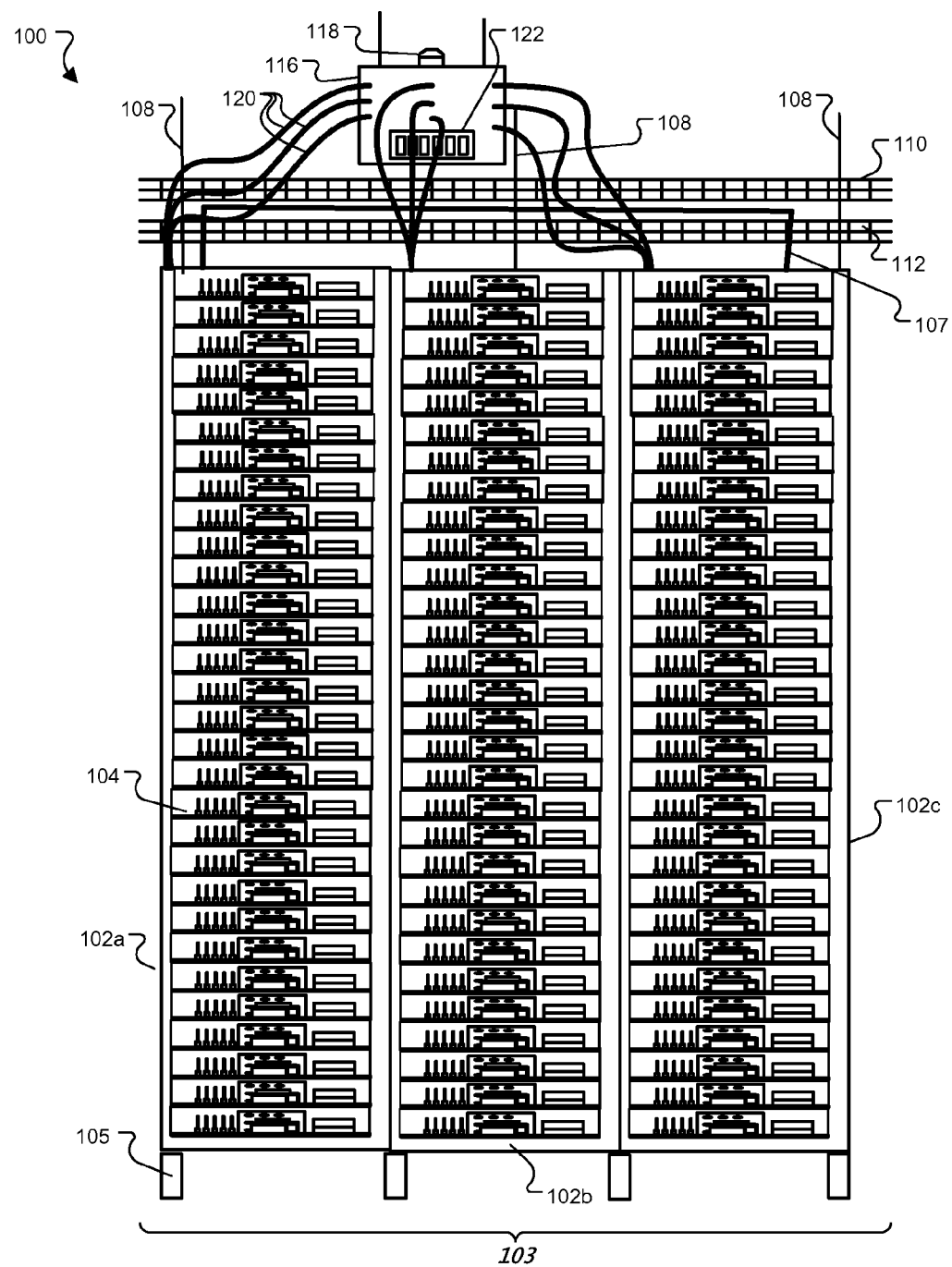
FIG. 1 is a front view of three computer bays with an associated electrical distribution system.

FIG. 1 is a front view of three computer bays 102a-c with associated electrical distribution system 100. In general, the system 100 provides necessary support for a number of computers or computer-related pieces of equipment. Such computer-related pieces of equipment may include equipment for circulation of cooling air across the computers, along with cooling and recirculation of the air. In addition, electrical service may be provided in a coordinated fashion to the various portions of the system, including the computers and computer-related pieces of equipment, and to supporting components in the system 100, such as fans, networking equipment, pumps, uninterruptible power supplies (UPS's), and other ancillary equipment for operating the computers.

The bays 102a-c together form a computer rack 103. The bays are tied together into a single unit—the rack—and may thus be moved and positioned together. Other forms and sizes of racks may also be used, such as racks that are formed by a single bay. The particular terminology of rack or bay for the components is used here for illustrative purposes only, however, and various other implementations of computing devices and support structures are covered by such terminology.

The bays 102a-c may provide a physical structure that holds a number of computer trays that are made of or include computer circuit boards, or motherboards, and the system 100 may supply and distribute electrical power to those circuit boards. For physical support, bays 102a-c each have a peripheral frame that may be constructed, for example from bent sheet metal, aluminum, various extruded materials (e.g., plastics) or other sufficiently strong but adequately low weight and low cost materials. Shelves (not shown) may be provided inside the frames and may be spaced vertically so as to support computing equipment from near the top of the rack to near the bottom of the rack. For example, angled brackets may run from the front to the back of the racks 102a-c at spaced positions up and down the side edges of the rack frames.

In one implementation, the bays 102a-c may each be constructed much like a typical bakery rack, with a rectangular peripheral frame, and spaced brackets along each side up and down the frame. Computer motherboards or other forms of computing devices, which may be termed trays 104, may be slid over the brackets of the bays 102a-c and removed by pulling them out. The term "tray" is not limited to any particular arrangement, here, but instead includes any arrangement of computer-related components coupled together to serve a particular purpose, such as on a motherboard.

The bays 102a-c may also include a number of casters 105 or other mechanisms for allowing convenient movement of the rack 103. Four casters may be placed at the corners of the rack 103, though in the pictured embodiment, casters 105 are also shown at locations in the middle of the rack 103, so as to provide additional structural support to the middle of rack 103, and to prevent sagging of the rack 103 when it is loaded with computing devices. In some embodiments, the casters 105 may elevate the bays 102a-c to assist with cooling the trays 104. For example, cool air sinks downward, and with the bays 102a-c raised off the floor, cool air at floor level may be drawn in through the bottoms of the bays 102a-c to help cool the computer trays 104.

Bays 102a-c may also function in ways other than to hold computing components. For example, all or part of a bay may be provided with fans, ductwork, and/or cooling coils and attendant equipment to serve as part of a cooling system for a datacenter. For example, every n-th bay in a system may be an air circulation bay, or partially an air circulation bay (e.g., the lower half of a bay may circulate air when the bays rest on a raised floor having a hot plenum beneath).

In the illustrated example, the bays 102a-c may accommodate the horizontal mounting of approximately thirty trays 104 each—or the rack 103 may accommodate up to ninety trays 104. Such an arrangement may permit the trays to be located, top-to-bottom, so as to be conveniently serviced by personnel without the need for inconvenient stools, ladders, or other mechanisms. The width of the rack may also be such that the rack can be transported easily (e.g., in standard-sized tractor trailers) and may be moved relatively easily within a data center (e.g., so that they are not too wide or too heavy for personnel to move them easily).

The trays 104, which may simply be motherboards carrying various computing components and having insulated areas where they contact rails in the bays 102a-c that may be supporting them. The trays 104 may be generally mounted parallel to other trays in a horizontal or vertical stack, so as to permit denser packing than would otherwise be possible with computers having free-standing housings and other components.

The trays 104 may be implemented in particular configurations, including as computer servers, switches (e.g., electrical and optical), routers, drives or groups of drives, and other computing-related devices. In general, the trays 104 in a system take a standardized physical and electrical form to be easily interchangeable from one location in the system to another, but the trays 104 may take other appropriate forms also.

The trays 104 are shown in the figure as having open fronts. Such an arrangement may permit air from a workspace in front of the trays 104 to be pulled across the trays 104, such as by fans at the backs of the trays 104 and/or vacuum created at the backs of the trays 104 by a central air circulation system. Such air may then be cooled and returned to the workspace, where it can again be pulled across the trays 104 (and thereby heated again). Open fronts may also permit easier access to the trays 104 such as for servicing, removal, and maintenance.

Air circulation unit 107 may be located behind bays 102a-c and may cool air drawn from the trays 104, as is shown in more detail in other figures below. In general, the unit may include a frame that may sit behind parallel rows of racks 103, and may have open sides through which warmed air from the racks 103 is drawn. The unit 107 may also include one or more cooling coils through which the captured air is circulated and cooled back to a temperature at which it may be circulated back through the system again. In addition, the unit 107 may include one or more fans for driving or drawing air through the coils and back into the datacenter workspace. While such a unified, modular solution is shown in this example for illustrative purposes, other arrangements of computer racks and air circulation and cooling equipment may also be employed.

The circulation unit 107 or the rack 103 may be provided with vertically-extending supports 108, which may extend upward to hold equipment above the rack 103. The supports 108 may, for example support wire trays 110, 112. In some embodiments, the wire trays 110, 112 may provide support for network cables, power cords, data cables, hoses, tubes, or other conduits such as those that may typically be found in a computer data center. The wire trays 110, 112 may be formed as basket-like structures into which cable may be laid easily, and that may have open outer edges for easily putting cable into the trays and taking it out.

The computer rack 103 with associated distribution system 100 may additionally include a power distribution box 116. The power distribution box 116 is electrically connected to an electrical supply such as one or more bus ducts (not shown) by a supply connector 118. The power distribution box 116 is also electrically connected to the bays 102a-102c by a number of power cords 120. In some embodiments, the computer bay 102a may be electrically connected to the power distribution box 116 by three of the power cords 120. In particular, a power strip, shown in more detail in figured described below, may be provided along a front edge of bay 102a, with electrical outlets provided in the strip for each of the trays in bay 102a. Other strips may be provided for other bays, e.g., bays 102b and 102c. In some embodiments, the wire trays 110 and 112 may support and organize the power cords 120.

The power distribution box 116 may include a number of features to permit efficient distribution of electricity received via supply connector 118, and provided via cords 120. For example, the power distribution box 116 can distribute electrical power from the supply connector 118 to the power cords 120 through a circuit breaker or fuse module 122 after splitting the power into multiple circuits, each associated with a particular breaker in circuit breaker module 122.

In some embodiments, the circuit breaker or fuse module 122 may include a number of circuit breakers equal to the number of the power cords 120 to which the power distribution box 116 is to be connected. For example, FIG. 1 illustrates the power distribution box 116 as being connected to nine of the power cords 120 and the circuit breaker or fuse module 122 may have nine circuit breakers or fuses, with each circuit breaker or fuse electrically connected between the power supply connector 118 and one of the power cords 120. In some embodiments, the circuit breaker or fuse module 122 may include a master circuit breaker or fuse between the aforementioned circuit breakers or fuses and the supply connector 116. The master circuit breaker or fuse may be rated for the total amperage that is expected to be passed from the supply connector 116 to the power cables.

In operation, the computer bays 102a-c may be mounted to form the computer rack 103 by welding, tacking, or otherwise joining the bays 102a-c to each other. After the rack 103 is assembled in whole or in part, it may be delivered to a computer data center, such as via standard freight tractor trailer, and may be positioned in a set-up area where a number of computing units may be slid into place in the rack 103.

A technician may mount computer boards 104 for the computing units flat horizontally in the computer bays 102a-c, such as by sliding one of the computer boards 104 into one of the computer bays 102a-c from the bay front, and over a pair of rails in the bay on opposed sides of the computer board 104 much like sliding a lunch tray into a cafeteria rack, or a tray into a bread rack. The trays 104 may alternatively be mounted vertically, such as in a bank of boards mounted at one level in a bay. The front of the bay may be kept open to permit easy access to, and replacement of, the computer boards 104 and to permit air to flow over the computer board 104 from a workspace where technicians or other professionals operating a data center may be located. In this context, the term workspace is intended to refer to areas in which technicians or others may normally be located to work on or access computers or other electronic equipment in a data center or other such facility.

The rack 103 may then be rolled into position in front of the circulation unit 107, and may be blocked in place so that it does not move, and so that air passing through the rack is received by the unit 107. Data cabling may then be pulled down from trays 110, 112 and connected to the trays 104 within the rack 103, such as to standard networking connectors (e.g., RJ-45 jacks via Cat-5 cabling, or fiber optic cable). Distribution box 116 may be moved into location and hung from infrastructure held by supports 108 or from other overhead infrastructure, and may be connected to a bus bar system in the facility (or may have previously been so connected). Power cords may then be connected to the circulation unit 107, such as to individual fans (or pumps) or pairs of fans (or pumps), from other distribution boxes (not shown). In addition, networking cabling may also be connected to unit 107, such as to permit unit 107 to report its status (e.g., pressures, temperatures, and existence of failed components) to a central system and to permit control of the unit 107 by the central system. Finally, power cords may be connected to power strips or other objects associated with rack 104, and may be plugged into distribution box 116. In appropriate implementations, there may be no physical power switches downstream of the distribution box 116, and the plugging in of the power cords 120 to the distribution box 116 may be considered, for purposes of rating organizations, as an effective switching action via its action as a disconnecting mechanism.

With appropriate power and data cabling connected, an operator may then boot the computers on the trays 104, begin a diagnostic sequence, and begin operations of the system. If an exception or failure occurs, the operator may bring down a part of the system for repair. For example, where the rack 104 includes three bays 102a-c that each include thirty trays, each bay may in turn be broken down into separate electrical circuits. For example, each bay may include three separate circuits, with ten trays powered by each circuit, so that the entire rack 104 would include nine distinct electrical circuits. As a result, if a computer in the top area of bay 102a fails, a cord for that computer may be unplugged from a power strip along bay 102a (along with data cabling) and the unit replaced, or the cord 120 for the ten trays around the failed tray may be unplugged for safety purposes. During such a replacement operation, the other twenty trays 104 in bay 102a may continue running (as may the remaining 60 trays in bays 102b and 102c). In this manner, servicing may occur under safe conditions while minimizing the disruption to the system.

Figure 2A:
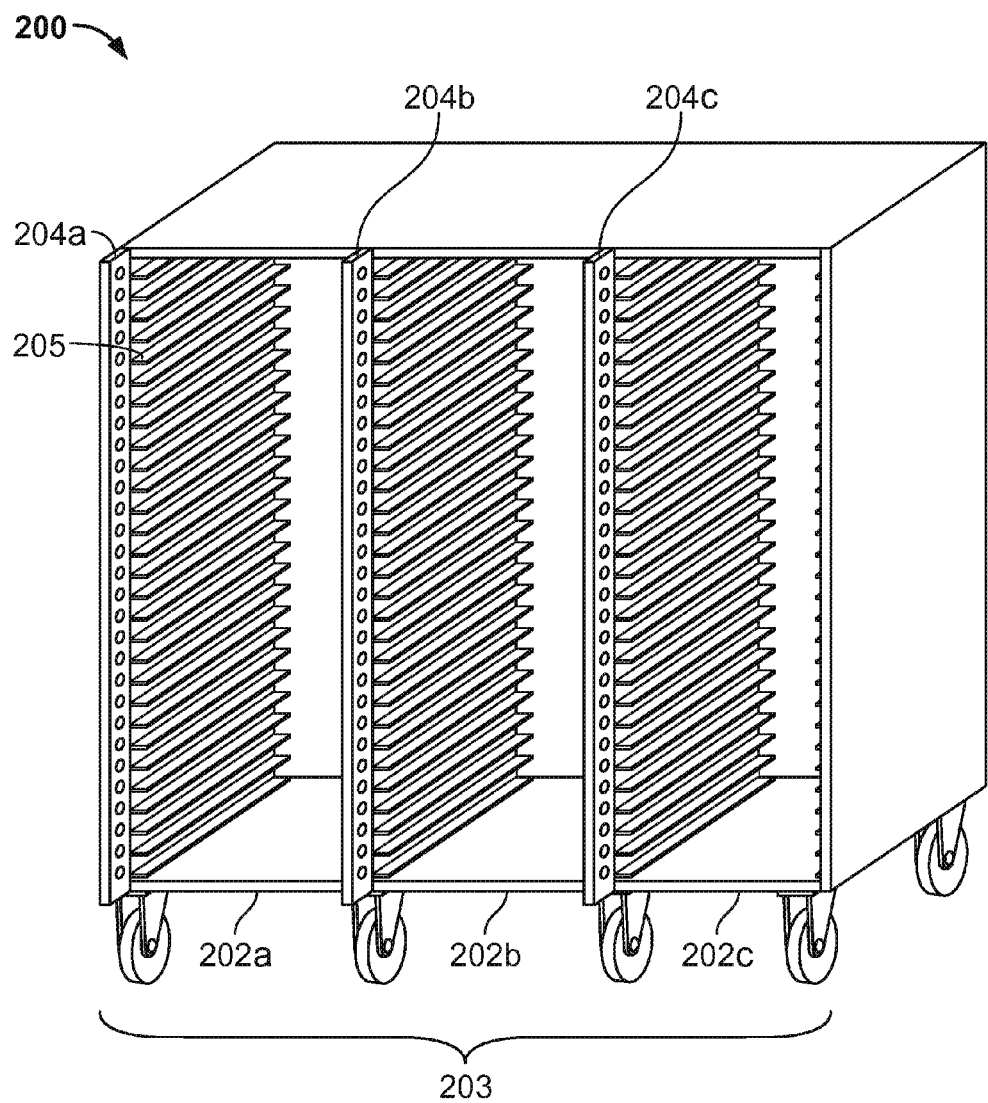
FIG. 2A is a perspective view of a computer rack, with the computer boards removed.

FIG. 2A is a perspective view of a computer rack 200 with its computer boards absent. In the view, one can see that bays 202a-c in the rack 200 are grouped together as a single unit. In some embodiments, the side walls of the bays 202a-c may include a number of support flanges, such as flange 205, upon which the computer boards may be placed in a manner similar to a cafeteria tray cart. In some embodiments, the bays 202a-c may be constructed to allow the computer boards to be mounted vertically in several levels. In some embodiments, the rack 203 may be substantially similar in form and function to the computer rack 103 shown in FIG. 1.

A power strip 204a is located at a front, left edge of bay 202a, as are similar power strips for the other bays 202b-c. The power strips are shown mounted vertically—attached to the front surface of the rack 203. The power strips 204a-c include a number of electrical outlets formed and located to distribute power to computer boards that may be mounted in the bays 202a-c. In the pictured example, the outlets are female connectors that point to the side so that plugs on cords that are attached to motherboard power supplies for each tray may be accessed conveniently, and so that the cords do not stick out into a work space in front of the rack 203. The power strips 204a-c may also be mounted inside the frames for the bays 202a-c, in a position so that trays may be slid pass them conveniently.

Figure 2B:
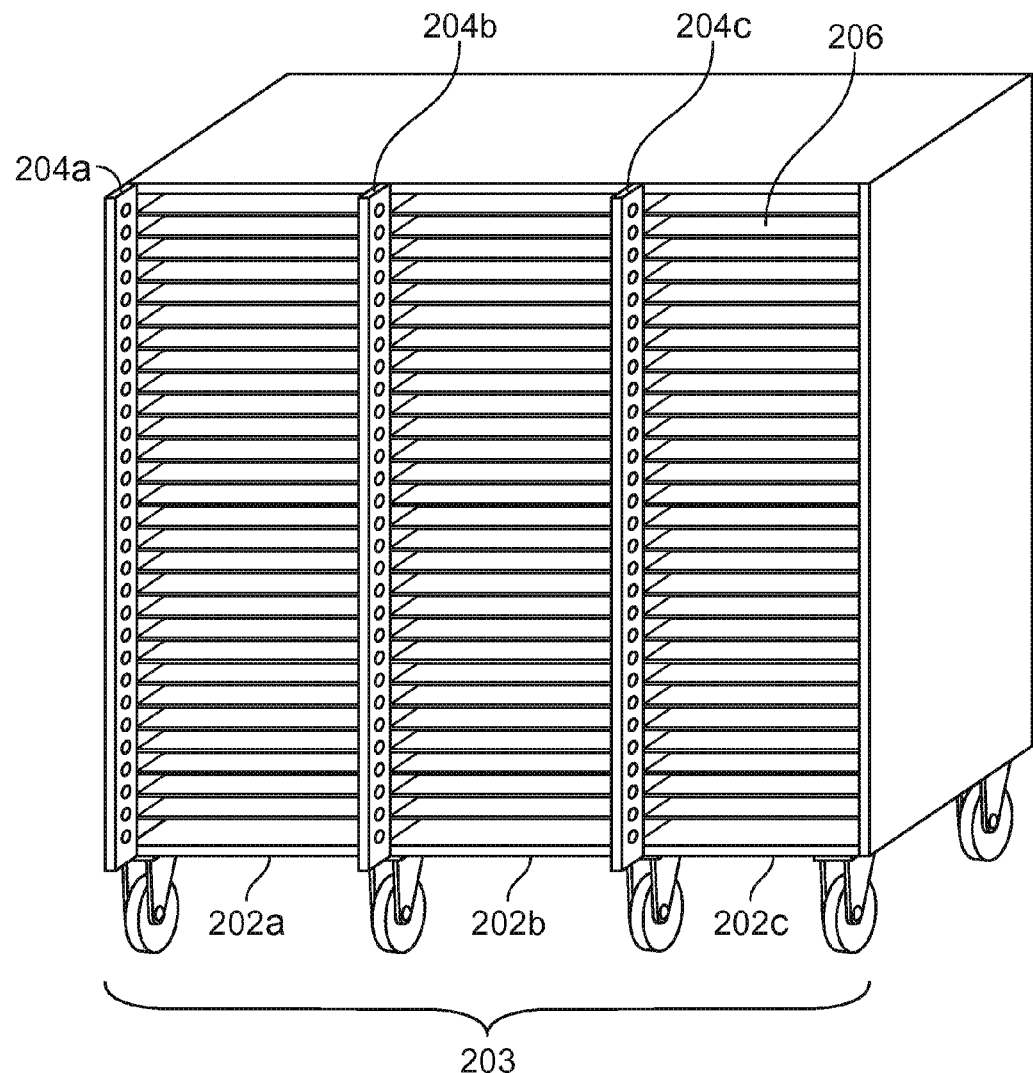
FIG. 2B is a perspective view of the computer rack of FIG. 2A, with the computer boards inserted.

FIG. 2B is a perspective view of the computer rack 203, but shown with the rack filled with trays 206, such as computer motherboards. Each of the motherboards is also shown with an associated plug that is plugged into the power strips 204a-c. Each of the trays may perform particular functions in the data center, such as computing, storage, or other such functions. Closer views of power strips like power strips 202a-c are show for additional illustrative purposes in the next two figures.

FIG. 3A shows a top view of a front corner of a computer bay 300, showing an electrical power strip (in cross section). FIG. 3B shows the view from FIG. 3A, with a computer board 316 inserted into the bay 300. In some embodiments, the computer bay 300 may be substantially similar in form and function to the computer bays 102a-c and 202a-c.

The bay 300 includes a support flange 302 that is mounted horizontally along the side wall of the bay 300. The flange 302 may be, for example, an angle iron that is tacked into a frame of the bay 300 at its ends, so that it may securely support trays during operation of the system. A panel may also be placed between adjacent bays to prevent air from mixing laterally, or the bay sides may be left open to permit such cross-circulation of air.

The bay includes a power strip support bracket 304, which may be part of the frame for the rack 300, and a power strip 306 that is vertically fixed along a front edge of the support bracket 304. Such a connection may be formed, for example by affixation, welding, claming, screws, magnetic connections, or other appropriate connecting structures.

The power strip 306 includes conductors for three distinct electrical circuits—308, 310, and 312 The section for FIG. 3A has been taken at a point high on the power strip 306, so that all three conductors, which each serve one-third of the electrical outlet on the strip, are shown. One circuit serves the top outlets along the strip, while the others may serve the remaining outlets. In general, the outlets served by each circuit 310, 312, 314, may be in a contiguous line along the power strip so that each circuit serves a physical zone along the strip.

Circuits 308, 310 may retain their insulation along the upper part of the power strip 306, before their service is needed. In contrast, the conductors for circuit 312 may have their insulation removed, and they may be attached directly, along their length to the outlets in power strip 306, such as outlet 314. The connection may occur, or example, by running each relevant conductor lengthwise down an interior area of the power strip housing in a manner that the conductors may be electrically connected (e.g., soldered) to each outlet as they pass by. For example, the circuit 310 may include a live power wire, a neutral power wire, and a ground wire, and each of the wires may be connected to a predetermined location around the back of each outlet so that the wires do not cross, even under severe operating conditions. A cross-section near the middle of the power strip 306 may show conductors for one insulated circuit (e.g., circuit 308) and un-insulated conductors attached directly to the outlets for another circuit (e.g., circuit 310). A cross section near the bottom of the power strip 306 may show only un-insulated conductors attached directly to the outlets (e.g., circuit 308). Such relationships between the circuits and the power strip are shown more clearly in FIGS. 4-6 and the accompanying description below.

Although the illustration of FIG. 3A depicts the three circuits 308-312, in some embodiments the power strip 306 may include other numbers of circuits. For example, the power strip 306 may include six circuits, and each circuit may independently distribute power to a number of power outlets. In some embodiments, the conductors may enter the power strip 306 near the top of the strip 306, and independently terminate at different vertical locations within the strip, as described above and below.

In FIG. 3B, the computer board 316 is at least partly held in position by support flange 302, onto which the board 316 may be placed. The board 316 may also be associated with other structure, though placing a board directly on the portions of the rack (perhaps with some electrical insulation) may have certain cost advantages to other techniques. Board 316 may hold a variety of components needed in a computer system. As shown, board 316 includes a bank of memory 322 connected to a processor 324. The memory 322 may be in the form, for example, of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner.

The computer board 316 is electrically connected to the power outlet 314 by a power plug 318 and an associated power cable 320. The power cable 320 may in turn be connected to a power supply (not shown) associated with the board 316. The power supply may be positioned, for example, at a back edge of the board 316 and may be mated to a circulation fan that draws air from the zone above the motherboard 316 through the power supply. In such a manner, heat generated by the power supply may be picked up by the system, but not until cooler air has circulated over the computer components, which may be more sensitive to high temperature levels than may be the components of the power supply.

Figure 3C:
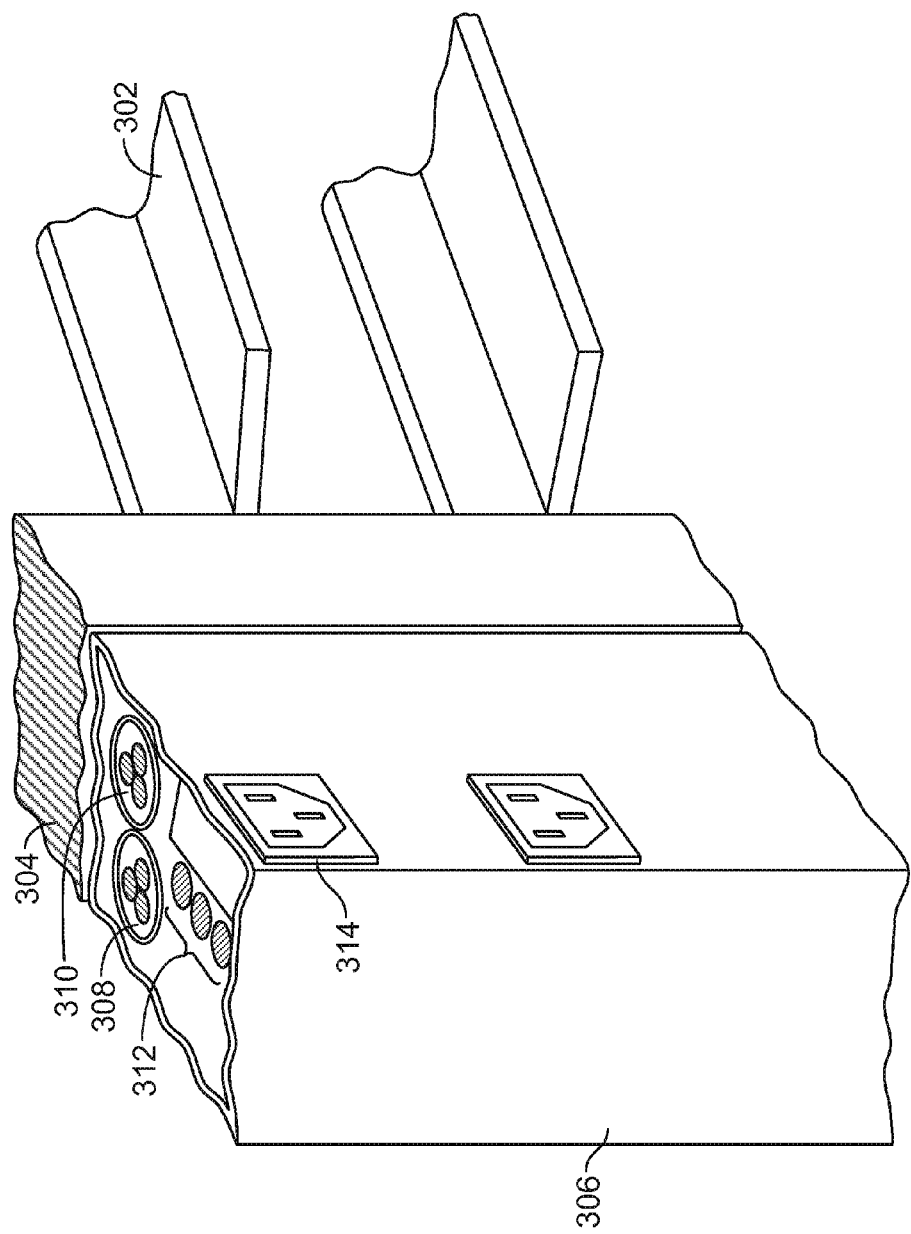
FIG. 3C shows a perspective view of the area shown in FIG. 3A.

FIG. 3C shows a perspective view of the area shown in FIG. 3A. This view shows the general relationship between support flange 302 and power strip 306. In particular, the support flange 302 is mounted to the back of, and its horizontal portions extend inward from, a front frame member 304 of the rack. Multiple power outlets are also shown on power strip 306, such as outlet 314. Generally, the outlets are spaced relatively equal to the space of supports for tray, so that power cords may be matched easily to particular electrical outlets on the power strip 306. The outlets are also offset to one side of the power strip to permit circuits 308, 310 to pass to lower levels in the power strip 306. In addition, added outlets may be provided on the power strip to serve additional purposes.

Figure 4:
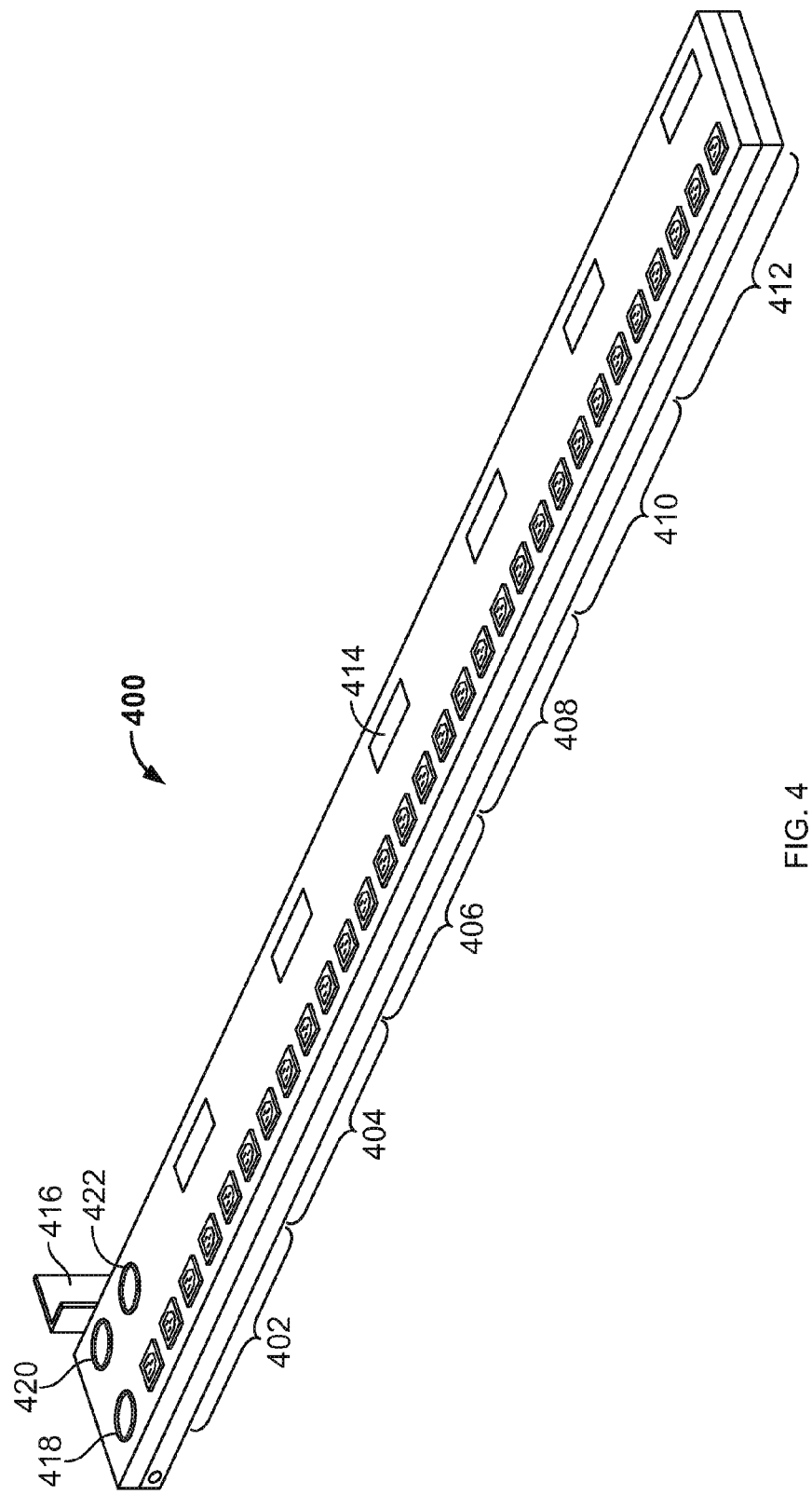
FIG. 4 shows a perspective view of a power strip.

FIG. 4 shows a perspective view of a power strip 400. In general, the power strip 400 is used to distribute power to a number of computer trays (such as the computer tray 104 in FIG. 1). The power strip 400 includes five outlet sections 402-412. Each of the outlet sections 402-412 includes a number of power outlets. In the illustrated example, each of the outlet sections 402-412 includes five power outlets. In some embodiments, the outlet sections could include one, two, three, four, five, or more power outlets. Each of the outlet sections 402-412 is associated with a distinct electric circuit that is electrically independent from the other outlet sections 402-412. Each outlet section 410-412 may also be provided with an independent internal electrical protection device (e.g., a fuse or circuit breaker) inside the power strip.

Alternatively, several bushings 418-422 may be provided at one end of the power strip 400 to permit for the connection of electric cords to the power strip 400 so that the power strip 400 may be connected to an electrical power source, such as the electrical distribution boxes discussed above. The bushings may be female fittings that accept male fittings on electrical cords, so that the cords may be added to the power strip easily on site. Alternatively, the items shown as bushings 418-422 may be sockets for fuses associated with the power strip 400, or other features associated with the power strip 400.

In operation, the power strip 400 may be used to distribute power from the cords (not shown) that enter bushings 418-422 to the outlet sections 402-412. Power from cords attached to each of the bushings may be applied to two outlet sections, or ten outlets in the example shown here. The outlets associated with each cord may be contiguous, so that one cord serves the first ten outlets, another serves the next ten, and so on. Circuits associated with each cord may extend down the power strip 400 inside the power strip housing.

The power strip 400 also includes a number of fuse panels such as fuse panel 414. The fuse panel 414 may be in an accessible location in the power strip housing in which fuses covering all or part of one or more outlet sections 402-412 may be placed and accessed for maintenance and repairs. For example, the outlet section 406 may be protected by a fuse that is accessible through the fuse panel 414 to allow the fuse to be inspected and/or replaced. In this example, each of the circuits for cords attaching to the power strip 400 at bushings 418-422 may split before passing through fuse panels 414, so that each branch (and each fuse for the branch) covers five outlets rather than ten.

Each of the five-outlet branches may, in one implementation be rated for 15 amperes, and a fuse, circuit breaker, or other appropriate structure mat be used to provide protection for that branch. Total rating for one cord may likewise be 30 amperes, and the rating for the strip 400 may be 3×30 amperes. As shown above and below, a central electrical distribution box may also include circuit breakers or other appropriate protection (e.g., fuses), at a higher general amperage rating and slower reaction speed. In this manner, the fuses closest to the load may be most likely to blow on downstream faults because they are faster than the upstream protection devices. Because such protection devices trigger faster than other devices located back at a distribution box, better protection coordination may be provided by such local and more finely tuned protection devices. The general relationship between power strips and electrical distribution boxes is shown in greater detail in FIGS. 10 and 11 below.

The power strip 400 is shown connected to a support bracket 416. In some embodiments, the support bracket 416 may be a support member that fixes the power strip 400 to a computer bay (e.g., the computer bay 102A of FIG. 1) in a computer rack (e.g., the computer rack 103). In some embodiments, the support bracket 416 may be part of the computer bay. In some embodiments, the support bracket may be part of a computer rack. The support bracket 416 may, for example, be screwed onto a top portion of a frame or may be joined to the frame by other mechanisms.

Figure 5:
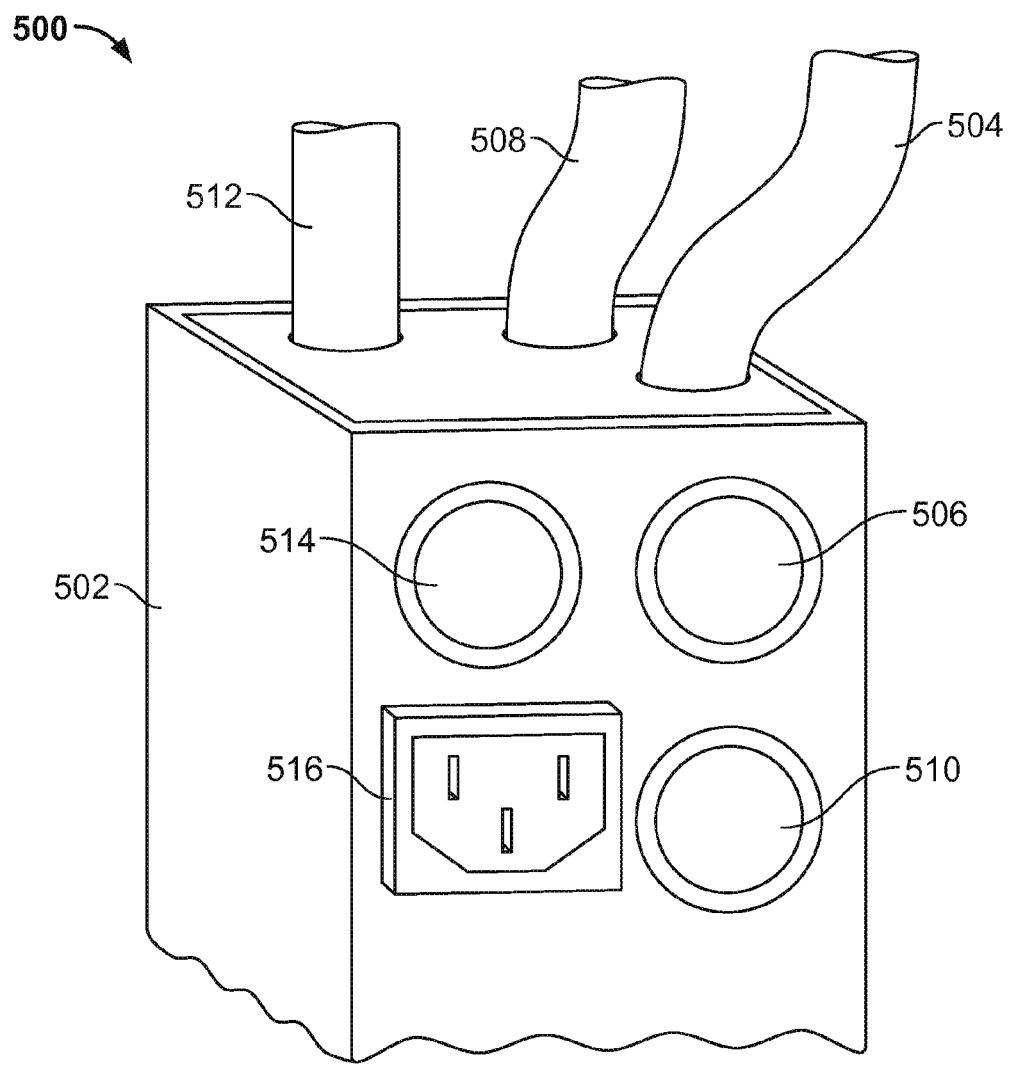
FIG. 5 shows a close up view of the top of a power strip.

FIG. 5 shows a close up view of the top of a power strip 500, which may be similar to power strip 400 in FIG. 4. Here, cords 504-512 are shown attached to three different bushings, and are heading off to an electrical distribution box (not shown). The power strip 500 includes a housing 502. In some embodiments, the housing 502 may be constructed of metal, plastic, or other suitable materials.

A cord 504 connects to an electrical connector 506, which is mounted on a side face of the power strip 500. Likewise, a power conductor 508 connects to an electrical connector 510 that is mounted on a side face of the power strip 500, and an electrical conductor 512 connects to an electrical connector 514 that is mounted on a side face of the power strip 500. In some embodiments, the electrical conductors 504-512 may be the power cords 120.

The power strip 500 also includes one or more power outlets, such as a power outlet 516. The power outlet 516 is mounted on a side face of the power strip 500, and other power outlets may be located on the same or on other sides of the power strip 500. In some embodiments, the power strip 500 may include a quantity of the power outlets 516 that is the same as the quantity of computer trays that a computer bay may be designed to support (e.g., 30). In some embodiments, the power outlets 516 may be located so that each of the power outlets 516 may be in relatively close proximity to the location of a computer tray in a computer bay. In operation, the power strip 500 distributes electrical power from the cords 504, 508, 512 to the power outlets. In other embodiments, the number of outlets may exceed the number of trays, so that there are spare outlets. Multiple trays may also share an outlet.

Where a large number of outlets are included on a power strip, such as about 30 outlets for serving computing devices that may draw 300-400 watts each, the incoming electrical needs of the strip may be such that relatively large and specialized cabling would be needed to provide the required amount of power—in the range of 90 amperes. As shown in FIG. 5, such peculiar cabling requirements may be avoided by providing multiple relatively standard conductors to the strip, with each associated with a zone of, and with separate circuit in, the strip. With such an approach, each circuit may be, for example, 30 amperes at 230-240 VAC, and may be served by 10 AWG or 4 mm2 cabling.

Figure 6:
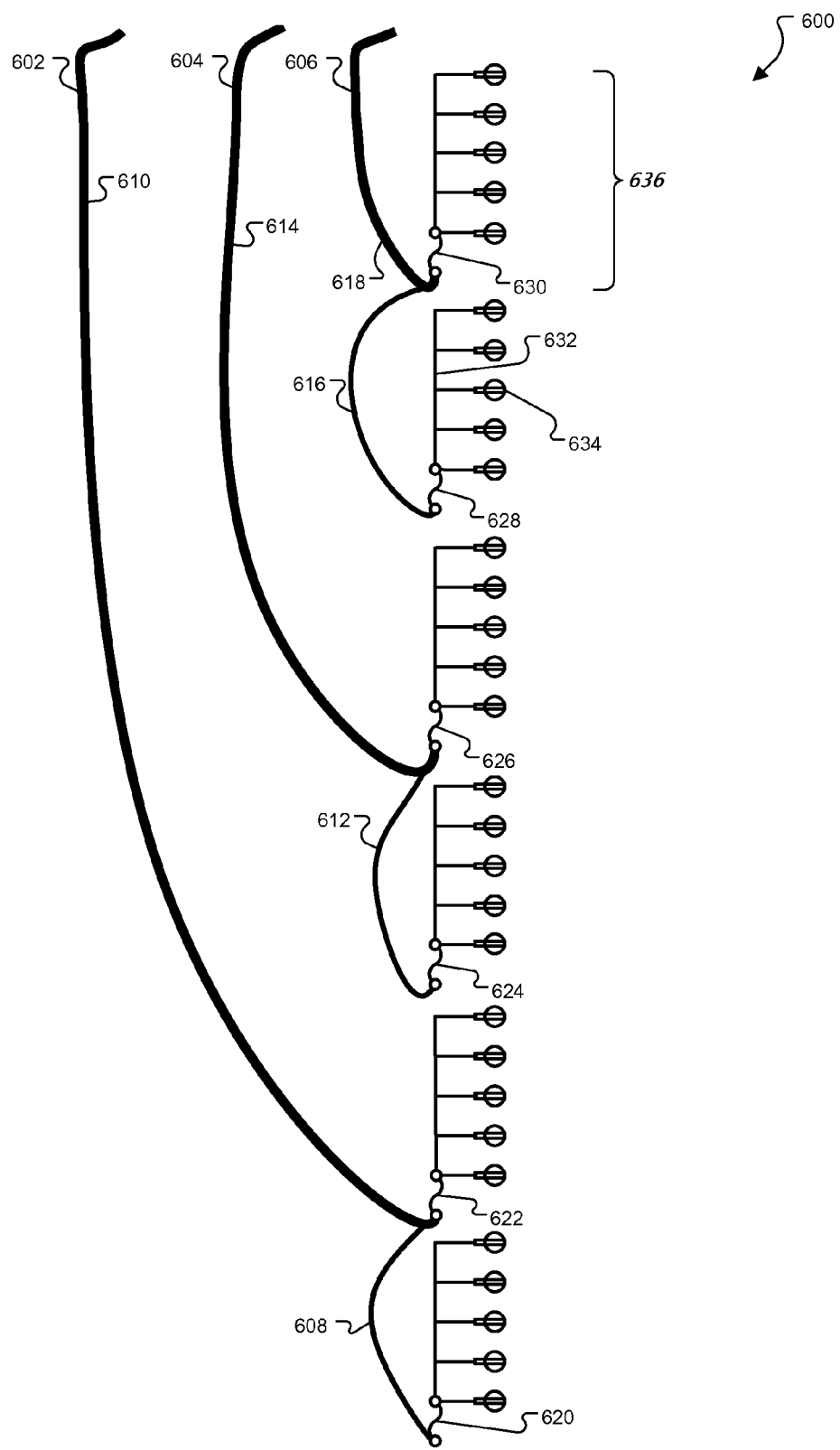
FIG. 6 shows a schematic diagram of a power strip.

FIG. 6 shows a schematic diagram of a power strip 600. In some embodiments, the power strip 600 may be substantially similar in form and function to the power strip 400 of FIG. 4. The power strip 600 includes a power conductor 602, a power conductor 604, and a power conductor 606. In some embodiments, the conductors 602-606 may connect to a power distribution box, such as the power distribution box 116 in FIG. 1. The power conductors 602-606 could each be split into pairs of subconductors within the power strip 600. In particular, the power conductor 602 is split into a subconductor 608 and a subconductor 610, the power conductor 604 is split into a subconductor 612 and a subconductor 614, and the power conductor 606 is split into a subconductor 616 and a subconductor 618. In some embodiments, the subconductors 608-618 may each carry one or more electrical subconductors. For example, the subconductor 608 may include a live electrical wire, a neutral electrical wire, and a ground wire.

The electrical subconductors 608-618 are electrically connected to a number of fuses. In particular, the subconductor 608 connects to a fuse 620, the subconductor 610 connects to a fuse 622, the subconductor 612 connects to a fuse 624, the subconductor 614 connects to a fuse 626, the subconductor 616 connects to a fuse 628, and the subconductor 618 connects to a fuse 630. The fuses 620-630 are electrically connected between the subconductors 608-618 and a number of power buses 632. In some embodiments, the power buses 632 distribute power from the fuses 620-630 to a number of power outlets 634. In some embodiments, a fuse, a power bus, and a number of power outlets may form an outlet section (e.g., an outlet section 636).

In operation, the power strip 600 is connected to a power supply by the conductors 602-606, and power is distributed through the fuses 608-618 and the conductors 620 to the outlets 622. In the illustrated example, each of the fuses 608-618 protects five of the power outlets 622.

In some embodiments, the fuses 620-630 may be located in close proximity to the outlet section that the fuse protects. For example, the fuse 630 may be located within a fuse panel (e.g., the fuse panel 414 of FIG. 4) that is located in the relative proximity of the outlet section 636. In some embodiments, the fuses 620-630 may be located to better localize the portions of the power strip 600 that the fuse 630 may protect. In this way, if the fuse 630 is blown, the source of the problem may be located quickly.

In some embodiments, the fuses 620-630 may be rated for an amperage that does not exceed the rated amperage for the conductors 608-618. For example, the conductors 602-606 may be connected to a power distribution box (e.g., the power distribution box 100) which protects each conductor with an independent 30 A circuit breaker. The fuses 620-630 may be rated at 15 A or less each; thus the amount of current that the fuses 628 and 630 may carry in parallel (15 A+15 A=30 A) may not exceed a total of 30 A. [needs refining]

In some embodiments, rating the fuses 620-630 in such a way that pairs of the fuses 620-630 do not exceed the rated amperage of the conductors 602-606 may increase the protection and/or serviceability of the power strip 600. For example, the power strip 600 may be plugged into the power distribution box 116 of FIG. 1. Without the fuses 628-630, a short circuit or other overcurrent situation at one of the power outlets 634 in the outlet group 636 may trip a circuit breaker in the box 100 thereby cutting power to the conductor 606 and all ten of the power outlets 634 that the conductor 606 supplies. By having the fuses 620-630 in the power strip 600, the same short circuit or overcurrent situation at one of the power outlets 634 may cause the fuse 630 to blow and only cut power to the five power outlets in the outlet group 636.

In some implementations, the power strip may be used to distribute power to a number of computer trays (e.g., the computer trays 104 of FIG. 1), and by reducing the number of power outlets 634 that are cut by a blown fuse, circuit breaker, or other similar protection device, a greater number of computer trays may remain powered up for use.

In some embodiments, the fuses 620-630 may offer redundant protection for the power conductors 602-606. For example, the power conductors 602-606 may be connected to the power distribution box 116 of FIG. 1. If a circuit breaker or fuse in the box 100 were to fail to open during an overcurrent situation, one of the fuses 620-630 may still blow and isolate the source of the problem. In some embodiments, the fuses 620-630 may provide increased electrical protection compared to circuit breakers. For example, the fuses 620-630 may blow more quickly than the circuit breakers in the box 100 may open during an overcurrent situation.

In some implementations, the fuses 620-630 may increase the amount of uptime for devices that may be plugged into the power strip 600. For example, an overcurrent situation may cause one of the circuit breakers in the distribution box 100 to blow and shut down ten of the computer trays 104. A technician may have to retrieve a stool or ladder (or go under a raised floor) in order to reach the box 100 and reset the open circuit breaker. Whereas, in another example, an overcurrent situation may cause one of the fuses 620-630 to blow and shut down five of the computer trays 104, as opposed to ten that may shut down with the circuit breaker, resulting in a reduced impact upon the total computing capacity of a data center. The fuses 620-630 may be within the reach of the technician and allow the technician to replace the fuse quickly, thereby reducing the amount of downtime for the affected computer trays 104.

Figure 7A:
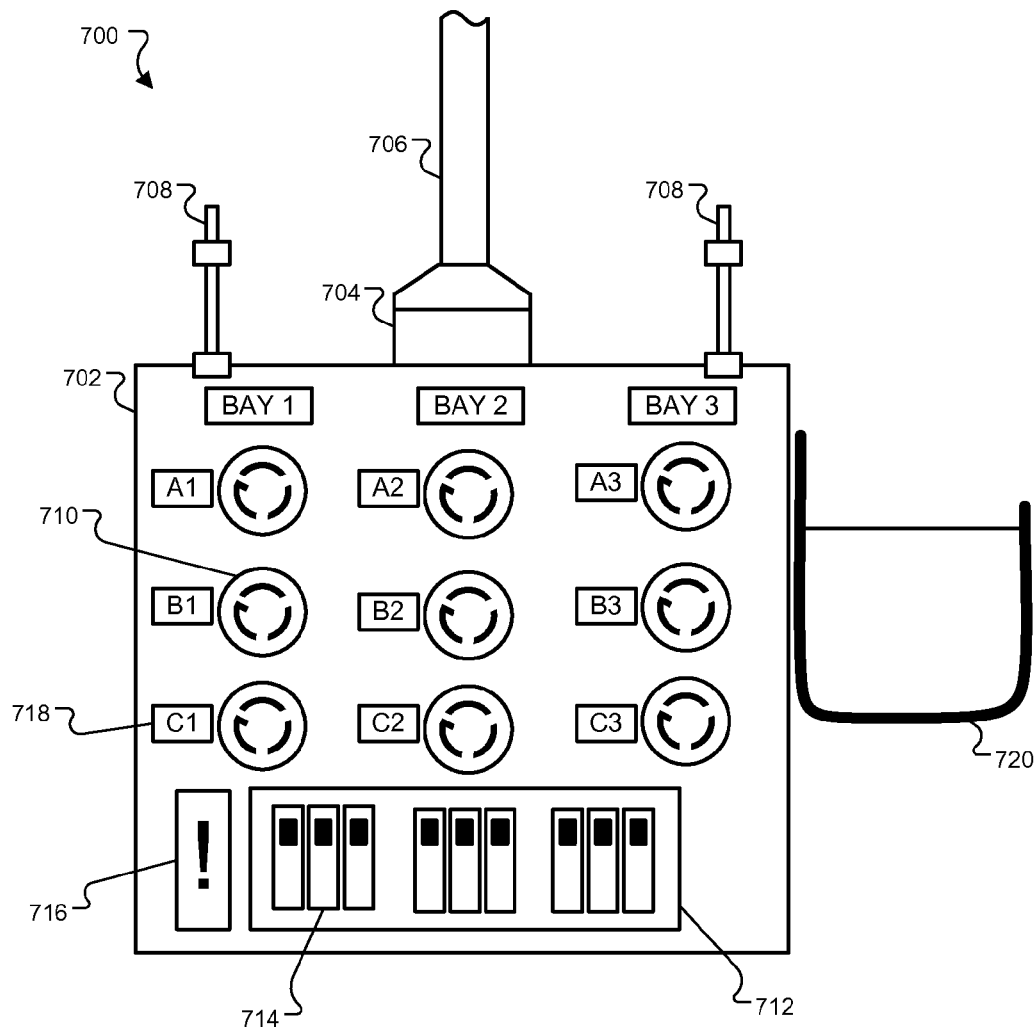
FIG. 7A shows an external front view of a nine-outlet power distribution box.

FIG. 7A shows an external front view of a nine-outlet power distribution box 700. In general, the power distribution box 700 is used to distribute power from a power source to a number of power outlets, and may be implemented, for example, as power distribution box 116 in FIG. 1 or in other manners.

The distribution box 700 includes a housing 702. In some embodiments, the housing may be constructed of metal, plastic, or any other suitable material. A terminal block 704 is fixed to the upper surface of the housing 702. The terminal block 704 is connected to a power conductor 706. In some embodiments, the power conductor 706 may be electrically connected to a power source, such as an electrical main or power bus. The power connector may be, for example, AWG2 and may be configured to carry 100 amperes at 230-240 volts.

The distribution box 700 is supported by a number of supporting rods 708. In some embodiments, the supporting rods 708 may extend upwardly to connect with a ceiling member or a bracket (not shown) to allow the box 700 to be suspended from the ceiling or bracket.

The distribution box 700 also includes a number of power outlets 710, and a circuit breaker/fuse box 712. In some embodiments, the power outlets 710 may be used to connect electrically to one or more power strips (e.g., the power strip 500 of FIG. 5). In the illustrated embodiment, nine of the power outlets 710 are included in the front face of the housing 702. The outlets may take the form, for example, of Leviton L6-30R female sockets that may mate with Leviton L6-30P male plugs. The circuit breaker/fuse box 712 includes a number of circuit breakers/fuses. In some embodiments, the number of circuit breakers or fuses may be equal to the number of the power outlets 710 that may be included in the distribution box. In the illustrated example, the circuit breaker/fuse box 712 includes nine of the circuit breakers 714.

Each of the circuit breakers is electrically connected between the terminal block 704 and one of the power outlets 710. In some embodiments, the circuit breakers 714 may be rated for the amperage that is expected to flow safely to devices connected to one of the power outlets 710. In some embodiments, the circuit breaker box 712 may include a master circuit breaker that may be connected electrically between the terminal block 704 and the circuit breakers 714. The master circuit breaker may be rated for the amperage that is expected to flow through the power conductor 706.

The power distribution box 700 also can include various labels, such as a warning label 716 and a number of identification labels 718. In some embodiments, the warning label 716 may be affixed to the surface of the housing 702 to warn of a risk of electric shock. In some embodiments, the identification label 718 and other similar identification labels may be affixed to the housing 702 to identify into which of the power outlets 710 a power conductor may be intended to be plugged.

The power distribution box 700 also includes a cable hook 720 that is attached to a side of the housing 702. In some implementations, power conductors that are connected to the box 700 may be passed through the cable hook 720 to support the weight of the conductors, to gather the conductors neatly, and to reduce the associated strain that may be exerted on the outlets 710 or electrical connectors that may be plugged into the outlets 710

Figure 7B:
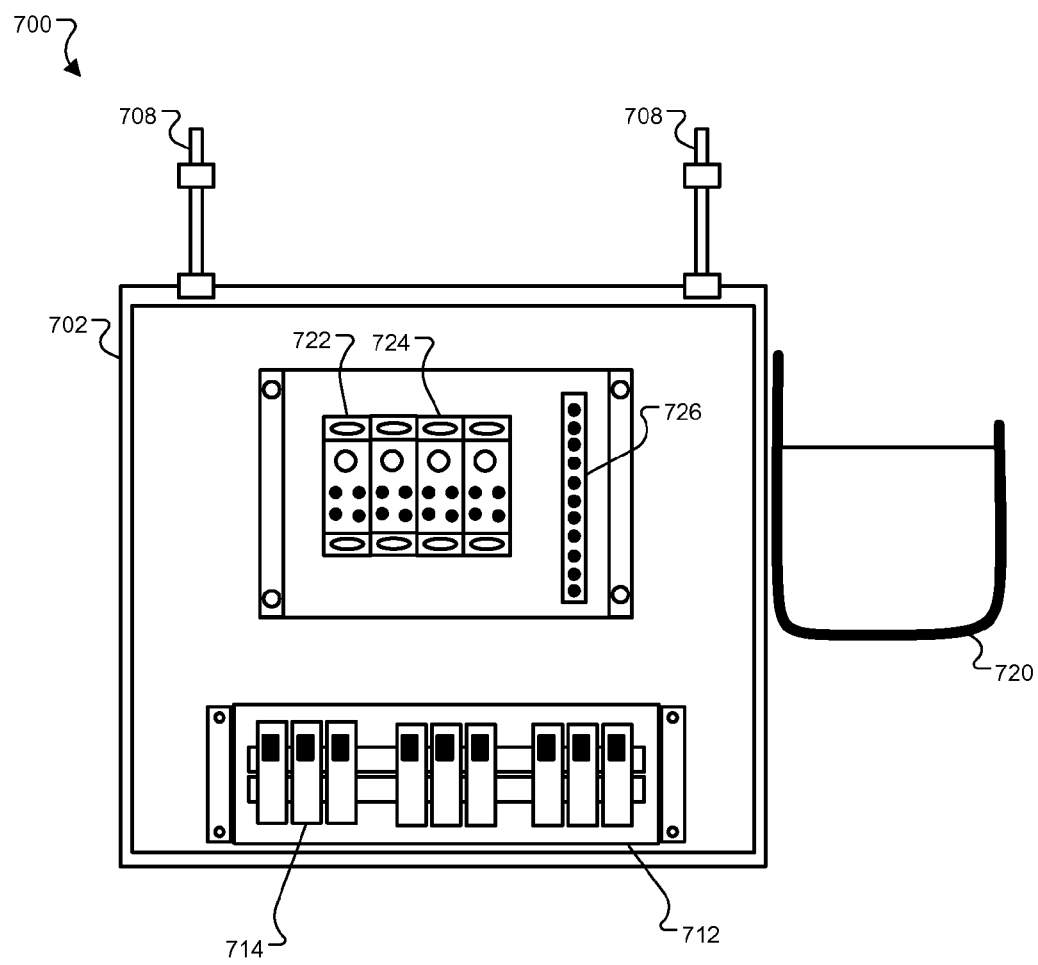
FIG. 7B shows an internal front view of the box of FIG. 7A.

FIG. 7B shows an internal front view of the box 700. The interior of the box includes a number of power distribution blocks 722, a number of neutral distribution blocks 724, and a ground bar 726. In some embodiments, the circuit breakers/fuses 714 may be electrically connected between the power distribution blocks 722 and the power outlets 710. In some embodiments, the neutral distribution blocks and/or the ground bar 726 may be electrically connected to the power outlets 710. In some embodiments, the ground bar 726 may be electrically connected to the housing 702.

Figure 7C:
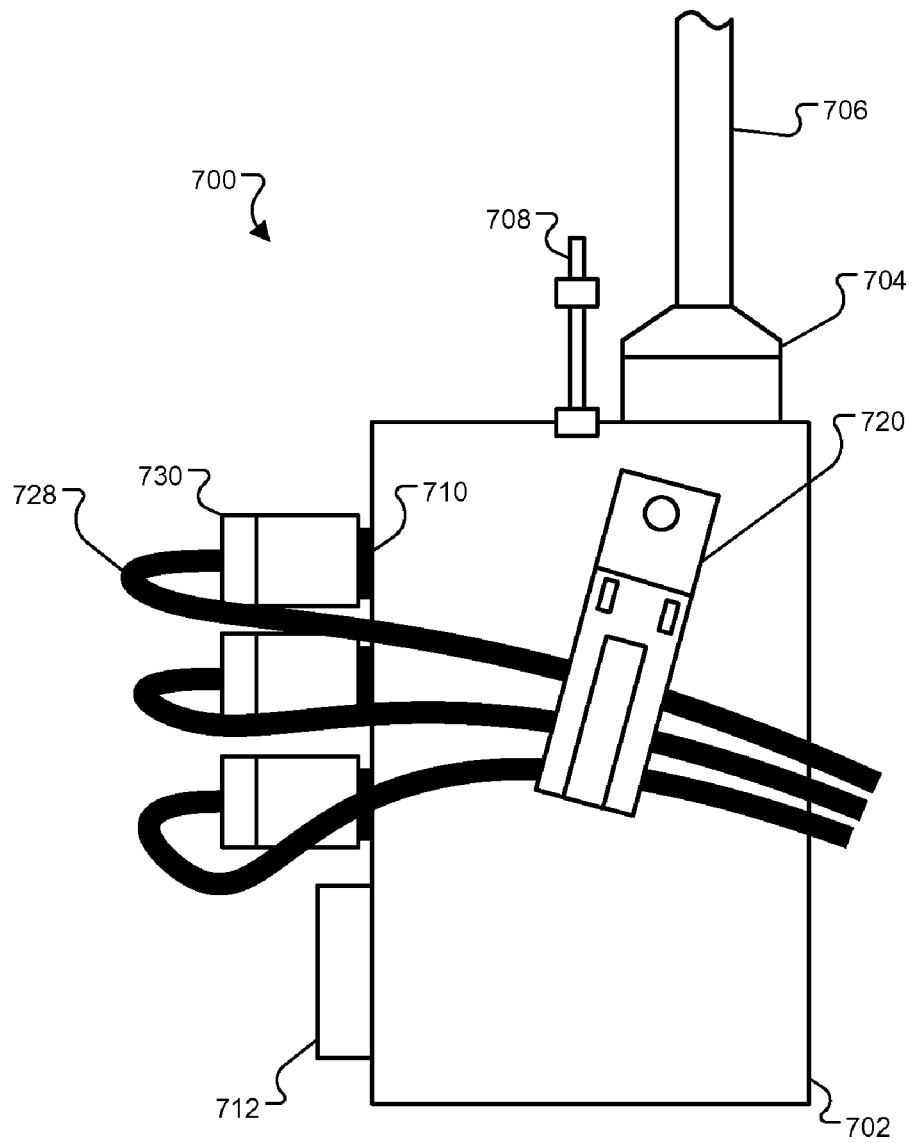
FIG. 7C shows an external side view of the box of FIG. 7A.

FIG. 7C shows an external side view of the box 700. This illustration shows more completely how a number of power conductors 728 may be electrically connected to the power outlets 710 by a number of power plugs 730. The power conductors 728 are at least partly supported by the cable hook 720. In some embodiments, the cable hook 720 may relieve strain that may be placed upon the power plugs 730 and the outlets 710 if the power conductors 728 were allowed to hang substantially straight down.

In operation, the power distribution box 700 may be connected to three power strips (e.g., the power strip 400 of FIG. 4) to distribute power to the power strips and to computer trays (e.g., the computer trays 104).

Figure 8:
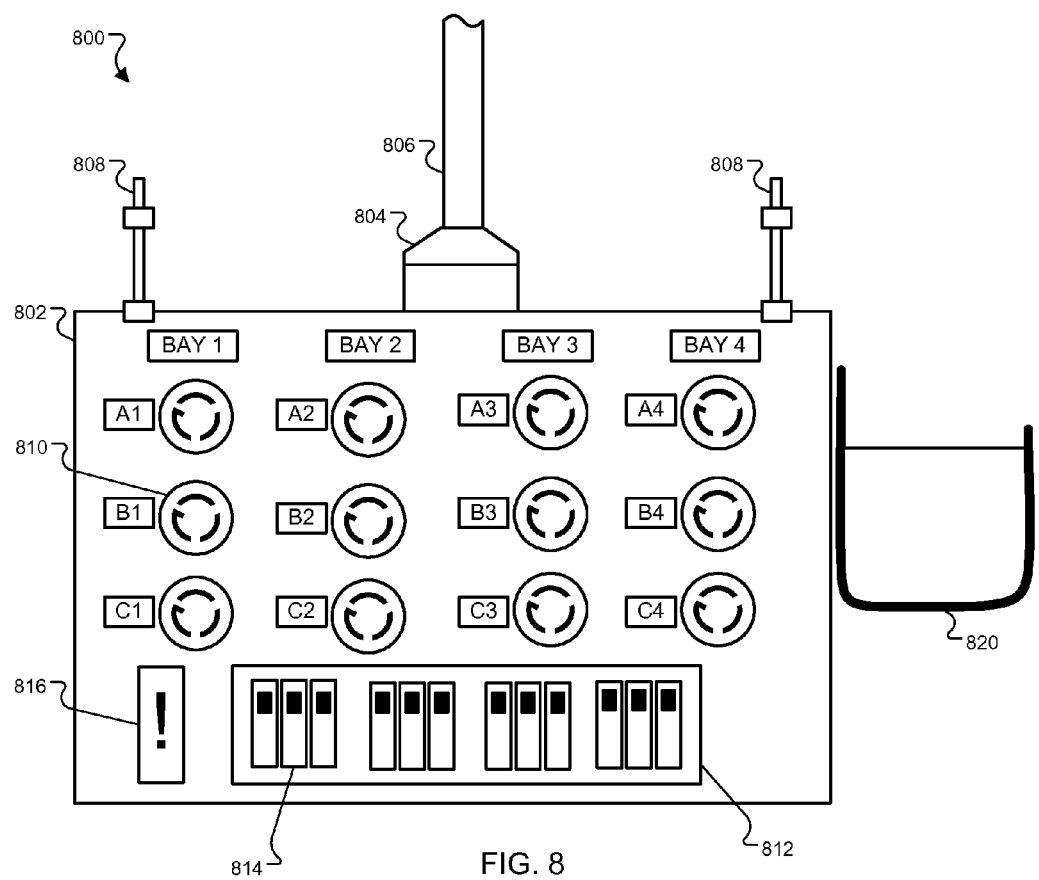
FIG. 8 shows an external front view of a twelve-outlet power distribution box.

FIG. 8 shows an external front view of a twelve-outlet power distribution box 800. In general, the power distribution box 800 is used to distribute power from a power source to a number of power outlets. The distribution box 800 includes a housing 802. In some embodiments, the housing may be constructed of metal, plastic, or any other suitable material. A power connector 804 is fixed to the upper surface of the housing 802. The power connector 804 is connected to a power conductor 806. In some embodiments, the power conductor 806 may be electrically connected to a power source, such as an electrical main or power bus. The distribution box 800 is supported by a number of supporting rods 808. In some embodiments, the supporting rods 808 may extend upwardly to connect with a ceiling member or a bracket (not shown) to allow the box 800 to be suspended from the ceiling or bracket.

The distribution box 800 also includes a number of power outlets 810, and a circuit breaker/fuse box 812. In some embodiments, the power outlets 810 may be used to connect electrically to one or more cooling units, and this scenario will be described in more detail elsewhere in this document. In the illustrated embodiment, twelve of the power outlets 810 are included in the front face of the housing 802. The circuit breaker/fuse box 812 includes a number of circuit breakers or fuses. In some embodiments, the number of circuit breakers to fuses may be equal to the number of the power outlets 810 that may be included in the distribution box. In the illustrated example, the circuit breaker/fuse box 812 includes twelve of the circuit breakers 814.

Each of the circuit breakers is electrically connected between the power connector 804 and one of the power outlets 810. In some embodiments, the circuit breakers 814 may be rated for the amperage that is expected to flow to devices connected to one of the power outlets 810. In some embodiments, the circuit breaker box 812 may include a master circuit breaker that may connected electrically between the power connector 804 and the circuit breakers 814. The master circuit breaker may be rated for the amperage that is expected to flow through the power conductor 806.

The power distribution box 800 also includes various labels, such as a warning label 816 and a number of identification labels 818. In some embodiments, the warning label 816 may be affixed to the surface of the housing 802 to warn of a risk of electric shock. In some embodiments, the identification label 818 and other similar identification labels may be affixed to the housing 802 to identify into which of the power outlets 810 a power conductor may be intended to be plugged. The power distribution box 800 also includes a cable hook 820 that is attached to a side of the housing 802, to support and organize the conductors.

The power distribution box 800 may thus be similar to power distribution box 700 in FIGS. 7A-7C. However, power distribution box 800 may be used for different purposes than power distribution box 700, as described in more detail below. For example, where an air circulation unit is associated with a number of computing racks, power distribution box 700 may serve the computing rack or racks, while distribution unit 800 may serve the air circulation unit. The individual circuits form the distribution unit 800 may serve, for example, fans or fan groups, control circuitry, networking support equipment, and other similar features.

Figure 9:
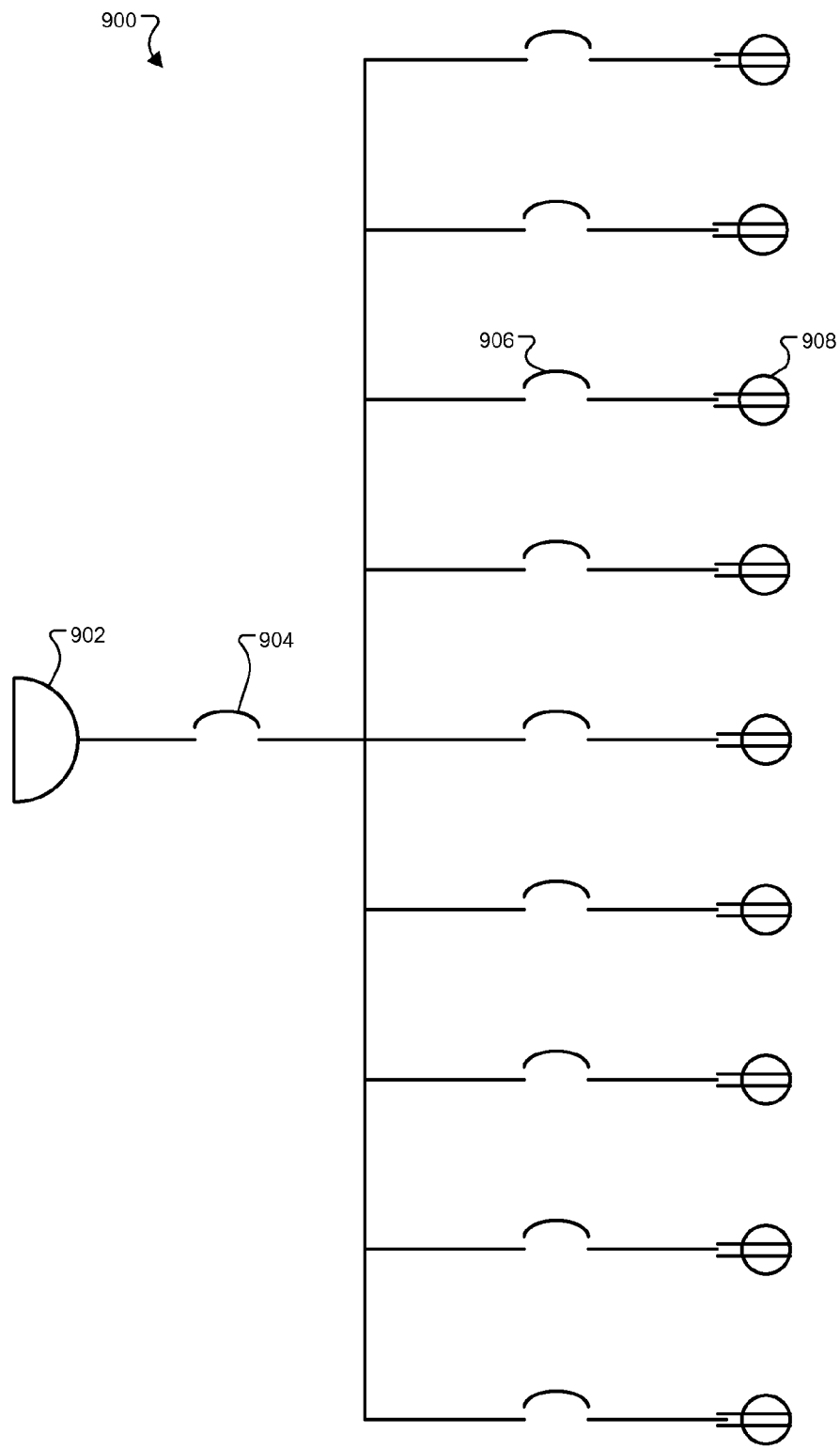
FIG. 9 is a schematic diagram of a nine-outlet power distribution device.

FIG. 9 is a schematic diagram of a nine-outlet power distribution device 900. In some embodiments, the device 900 may be the power distribution device used by the power distribution box 700 of FIG. 7. The device 900 includes a power connector 902 or other sort of connecting device, a master circuit breaker 904, a number of circuit breakers/fuses 906, and a number of power outlets 908.

In some embodiments, the power connector 902 may connect to a power conductor (not shown) to electrically connect to a power source. The power connector is also electrically connected to the master circuit breaker/fuse 904. In some embodiments, the master circuit beaker/fuse may be rated for the rated amperage of the power connector 902 and/or the power conductor.

The master circuit breaker/fuse 904 is electrically connected to the circuit breakers 906. The circuit breakers/fuses 906 connect to and protect loads served by the power outlets 908. In some embodiments, the circuit breakers 906 may be rated for the amperage that is expected to flow through the power outlets 908 at a safe peak level. For example, the device 900 may be intended to distribute power to a number of the power strips 500 of FIG. 5. If the power conductors 504, 508, and 512 are rated at 30 A each, then the circuit breakers 906 may be rated at 30 A each. In some embodiments, the master circuit breaker 904 may be rated to match or exceed the total current expected to flow through the power outlets 908. For example, if the circuit breakers 906 are rated at 30 A each, then the master circuit breaker may be rated at 90 A (30 A×3 circuit breakers/fuses/phase (in a three-phase system)=90 A in a three phase system) or less.

Figure 10:
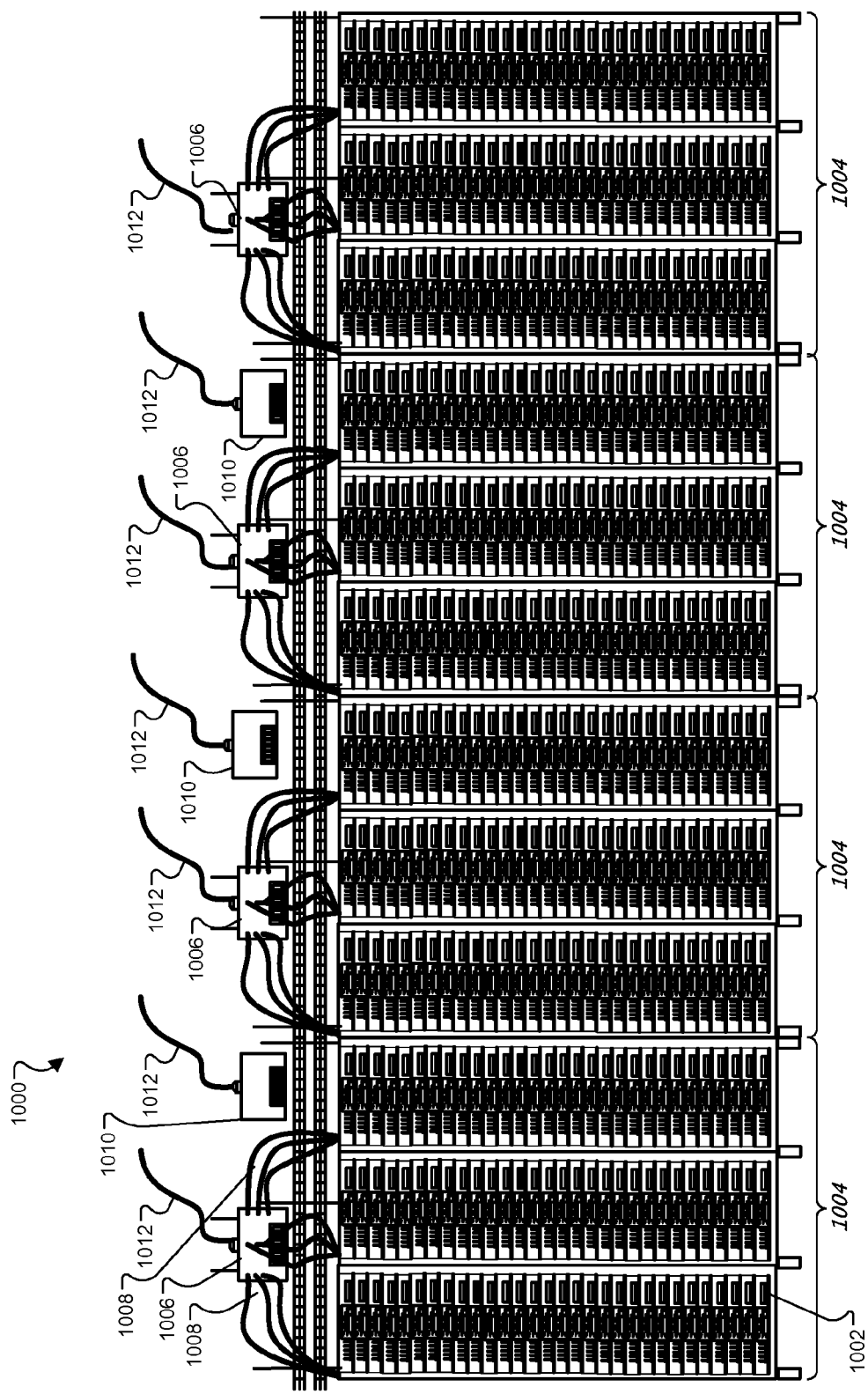
FIG. 10 is an elevation view of computer server racks and an associated power distribution sub-system.

FIG. 10 is an elevation view of computer server racks and an associated power distribution sub-system 1000. The illustrated computer server racks and the associated power distribution sub-system include a number of computer bays 1002. In some embodiments, the bays 1002 may be similar to the computer bay 102a of FIG. 1. The bays 1002 are gathered together in groups of three bays to form a number of three-bay computer racks 1004.

The bays 1002 are electrically connected to a number of nine-outlet power distribution boxes 1006. In some embodiments, the nine-outlet power distribution boxes 1006 may be suspended from a ceiling or other overhead support. A number of power conductors 1008 connect between the bays 1002 and the nine-outlet power distribution boxes 1006. Three of the power conductors 1008 connect between one of the bays 1002 and one of the nine-outlet power distribution boxes 1006, in other words, nine of the power conductors 1008 connect between one of the racks 1004 and a nine-outlet power distribution box 1006. In some implementations, one of the nine-outlet power distribution boxes 1006 may be implemented to distribute power to one of the computer racks 1004.

The illustrated computer server racks and the associated power distribution sub-system can also include a number of twelve-outlet power distribution boxes 1010. In some implementations, the twelve-outlet power distribution boxes 1010 may distribute electrical power to a number of cooling units (not shown, but described in additional detail above and below). In some embodiments, the twelve-outlet power distribution boxes 1010 may be suspended from a ceiling or other overhead support. The nine-outlet power distribution boxes 1006 and the twelve-outlet power distribution boxes 1010 are electrically connected to a power bus (not shown) by a number of power conductors 1012. In operation, three of the computer bays 1002 may be connected to receive power from one of the nine-outlet power distribution boxes 1006. Generally, the power distribution boxes 1006, 1010 may be spaced and located so as to achieve a maximum cord length for conductors leading from the boxes 1006, 1010. For example, code requirements may limit cord length to a maximum length of fifteen feet, and the components may be located so that no cord needs to be longer than fifteen feet.

Figure 11:
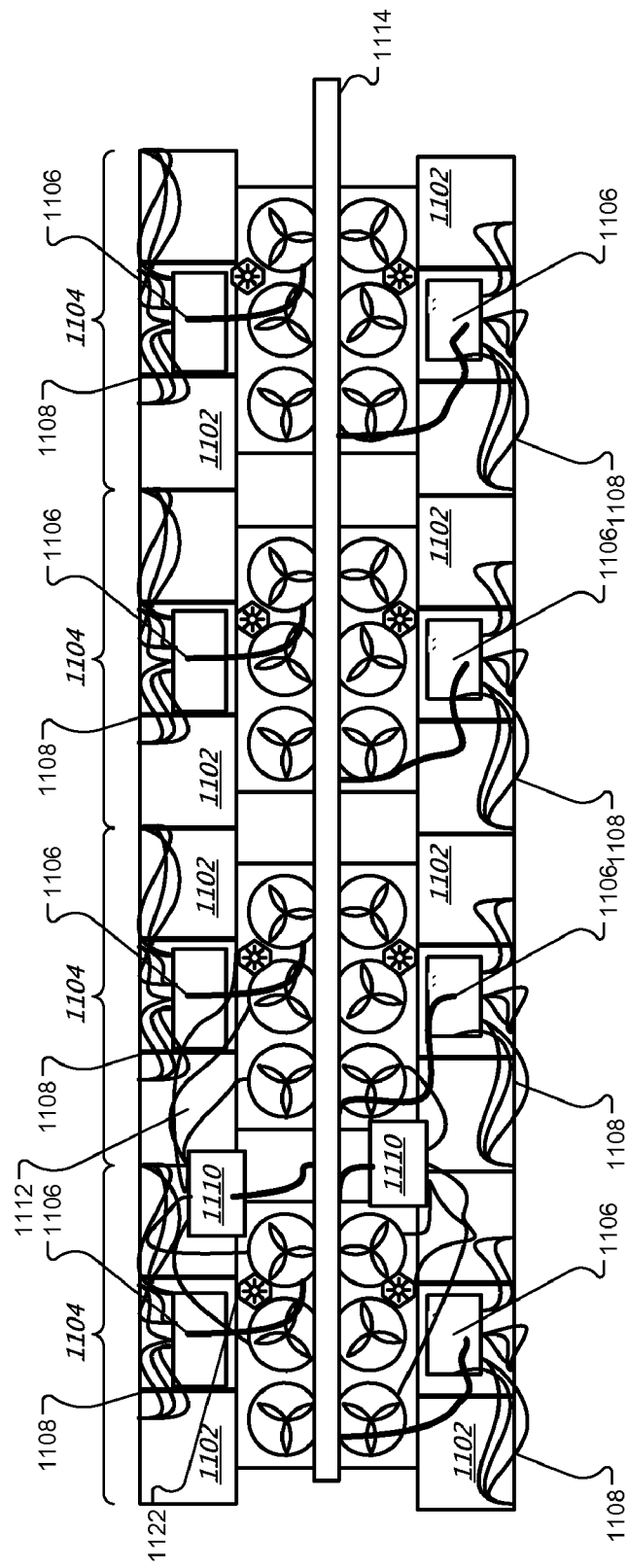
FIG. 11 is a plan view of computer server racks and an associated power distribution sub-system.

FIG. 11 is a plan view of computer server racks and an associated power distribution sub-system 1100. In some embodiments, the computer server racks and the associated power distribution sub-system may be the computer server racks and the associated power distribution sub-system illustrated in FIG. 10. The illustrated computer server racks and the associated power distribution sub-system includes a number of computer bays 1102. The bays 1002 are grouped as a number of racks 1004. In some embodiments, each of the racks 1004 may include three of the bays 1002.

The illustrated computer server racks and the associated power distribution sub-system also includes a number of nine-outlet power distribution boxes 1106, a number of power conductors 1108, a number of twelve-outlet power distribution boxes 1110, and a number of power conductors 1112. Certain of the boxes and wires have been omitted to provide greater clarity; for example, only one power distribution box 1110 is shown on each side of the power bus 1114, and only a subset of the wires normally extending from such boxes are shown. Each of the bays 1102 is connected to one of the nine-outlet power distribution boxes 1106 by three of the power conductors 1106. In some implementations, each of the nine-outlet power distribution boxes 1106 may connect to one of the racks 1104. The nine-outlet power distribution boxes 1106 are electrically connected to a power bus 1114 by a number of power conductors 1116. In some embodiments, the power bus 1114 may distribute power from a power source (e.g., electrical mains).

The illustrated computer server racks and the associated power distribution sub-system includes a number of cooling units 1118. The cooling units 1118 include a number of fans 1120 and a control box 1122. In some embodiments, the cooling units 1118 may include three of the fans 1120. In some implementations, the racks 1104 may be arranged on one or both sides of the cooling units 1118, with the backs of the computer bays 1102 adjacent to the cooling units 1118. The fans 1120 (perhaps along with fans located on each tray in a bay) draw air through the bays 1102 to cool a number of computer trays (e.g., the computer tray 104 of FIG. 1). In some embodiments, the control boxes 1122 are responsible for controlling the speed of fans and for reporting errors or failures with the fans to a central control system.

The fans 1120 and the control boxes 1122 are independently electrically connected to the twelve-outlet power distribution boxes 1110 by the conductors 1112. In some implementations, one of the twelve-outlet power distribution boxes 1110 may distribute power to operate the fans 1120 and the control boxes 1122 for three of the computer racks 1104.

In some implementations, some but not all of the fans 1120 and/or the control boxes 1122 on one of the cooling units 1118 may obtain power from a single twelve-outlet power distribution box 1110. For example, the fans 1120 and control box 1122 on one side of one of the cooling units 1118 may obtain power from one of the boxes 1110 while the other side obtains power from another one of the boxes 1110. In some implementations, independently powering the two sides of the cooling units 1118 with two of the boxes 1110 may increase the reliability of the cooling unit 1118. For example, if one of the cooling units 1118 is powered independently by two of the boxes 1110, then the cooling unit 1118 may continue to operate in the event that one of the boxes 1110 loses power.

The cooling units 1118 may have a unit length and/or unit-to-unit length (i.e., pitch) that differs from the unit length or unit-to-unit length of racks 1004. In other words, the various units may not match one-to-one. Such arrangement may open up the system to greater flexibility in layout for a data center. For example, standard cooling units 1118 may have their cooling capacity matched to heat load generated by racks 1004, even if the heat load of racks 1004 changes (e.g., by implementing lower-power microprocessors on the racks 1004). Such a change may be taken up by placing additional space between the cooling units 1118. Where space exists between cooling units 1118, air may pass from racks 1004 into the empty space between cooling units 1118 (and the space may be capped and sealed by a top blanking panel). Such air may then flow in ends of the cooling units 1118, i.e., laterally up and down the row of cooling units 1118 and may be drawn upward, cooled through cooling coils, and expelled back into the workspace.

Mismatched pitch between the racks 1004 and the cooling units 1118 may also provide a number of other advantages in certain implementations. For example, cooling units 1118 may be spaced to accommodate facility-based limitations, such as to envelope columns in a data center building. To make such columns disappear into a data center, the facility may be planned to located such columns in a hot aisle where the cooling units are aligned. Where the cooling units are not required to match up with the racks 1004, the cooling units 1118 may be positioned more flexibly to accommodate such column locations.

Figure 12:
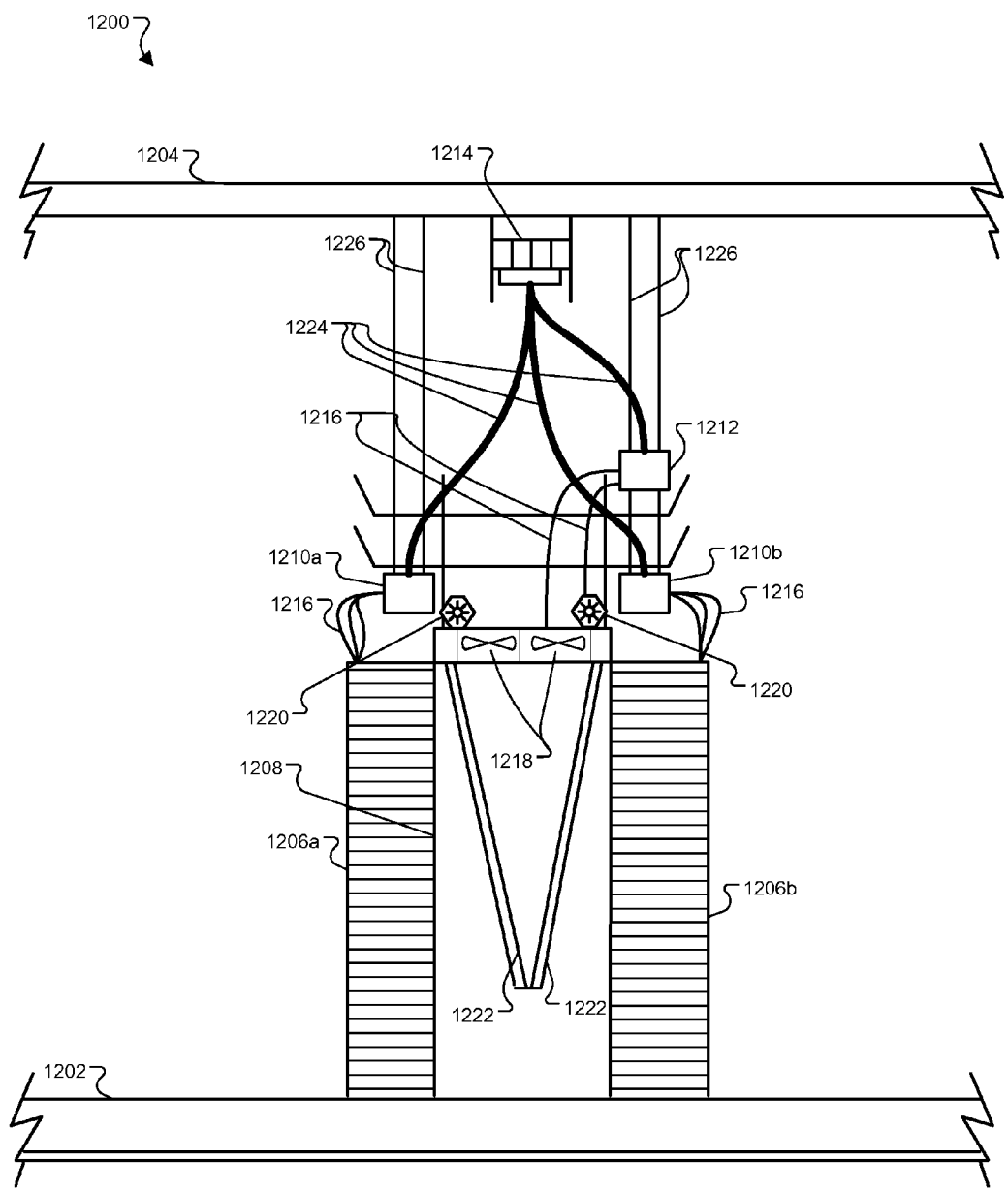
FIG. 12 is an external side view of computer server racks and an associated power distribution sub-system.

FIG. 12 is an external side view of computer server racks and an associated power distribution sub-system 1200. In some embodiments, the illustrated computer server racks and the associated power distribution sub-system 1200 may be the illustrated computer server racks and the associated power distribution sub-system 1100. The illustrated computer server racks and the associated power distribution sub-system includes a floor 1202, a ceiling 1204, a computer rack 1206a, a computer rack 1206b, a cooling unit 1208, a nine-outlet power distribution box 1210a, a nine-outlet power distribution box 1210b, a twelve-outlet power distribution box 1212, and a power bus 1214.

The computer racks 1206a-b are electrically connected to the nine-outlet power distribution boxes 1210a-b by a number of power conductors 1216. In some implementations, the computer rack 1206a may be electrically connected to all nine outlets of the nine-outlet power distribution box 1210a.

The computer racks 1206a-b are located adjacent to, and on opposed sides of, the cooling unit 1208. In some embodiments, the cooling unit 1208 may be configured to cool air received from the computer racks 1206a-b. The cooling unit 1208 includes a number of fans 1218, such as six axial-flow fans in three pairs, a pair of control boxes 1220, and a pair of cooling coils 1222. The fans 1218 and the control boxes 1220 may be electrically connected to the twelve-outlet power distribution box 1212 by a number of power conductors 1216.

The nine-outlet power distribution boxes 1210a-b and the twelve-outlet power distribution box 1212 are connected to the power bus 1214 by a number of power conductors 1224. In some embodiments, the power bus 1214 may distribute power from electrical mains. The power bus 1214 may carry, for example, approximately 1000 amperes. The nine-outlet power distribution boxes 1210a-b and the twelve-outlet power distribution box 1212 are suspended from the ceiling 1204 by a number of support rods 1226. The boxes 1210a-b may connect to the power bus 1214 using prefabricated plug-in units—or taps.

In operation, the fans 1218 draw air hot air received from the computer racks 1206a-b, causing the hot air to be drawn from a common plenum behind the computer racks 1206a-b up through cooling coils 1222. In some embodiments, the coils 1222 may circulate a fluid coolant, such as water, antifreeze, air, Freon, ammonia, or other fluid that may absorb heat. In some embodiments, the coils may be part of a solid heat removal device, such as a heat pipe. As the hot air is drawn through the coils 1222, the coils absorb some of the heat energy from the air and cool it. Air may flow under the coils 1222 in addition to flowing laterally in a row of units (e.g., in and out of the page) to provide greater cooling diversity to the system, as air can flow from areas where components are not working properly to areas in which they are.

Figure 13:
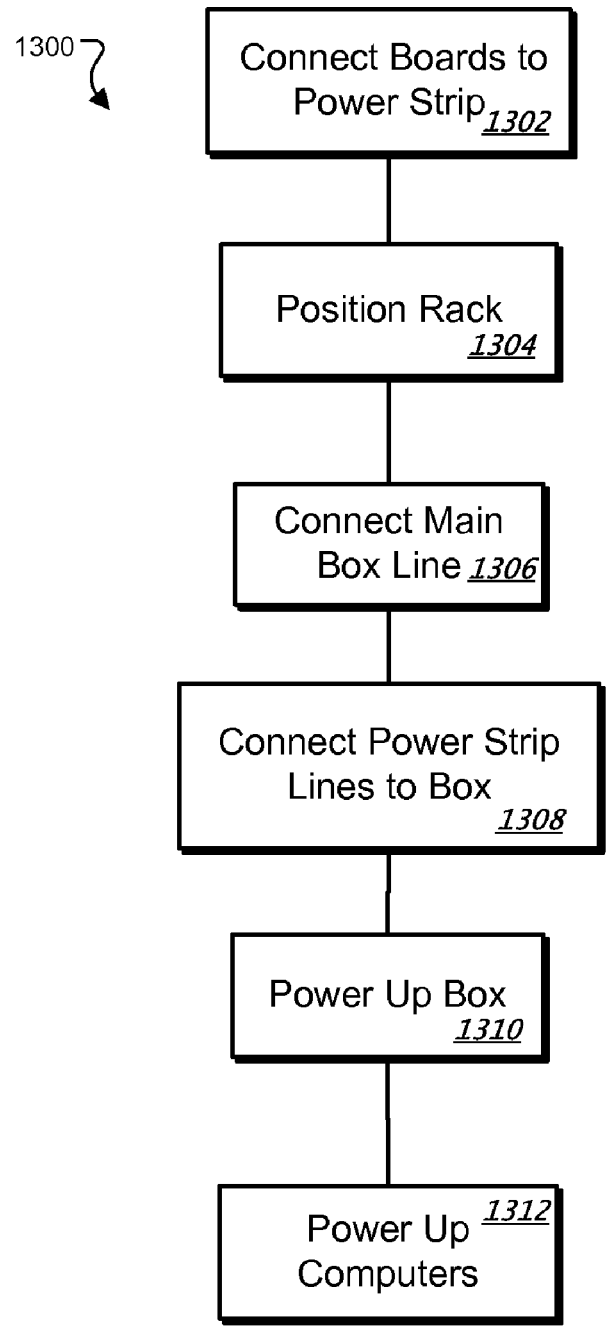
FIG. 13 is a flow chart showing actions for configuring a power distribution system for one or more computer server racks.

FIG. 13 is a flow chart showing actions 1300 for configuring a power distribution system for one or more computer server racks (e.g., the computer racks 103 of FIG. 1). At step 1302, a technician connects computer boards (e.g., the computer trays 104) to a power strip (e.g., the power strip 400 of FIG. 4). At step 1304, the technician positions the rack and connects the grounding strap. In some implementations, the position of the rack may bring the rack into close proximity to power and/or cooling sources.

At step 1306, the technician connects a main power distribution box line. In some embodiments, this step may describe the process of electrically connecting one of the nine-outlet power distribution boxes 1106 (of FIG. 11) to the power bus 1114. At step 1308, the technician connects a power strip (e.g., the power strip 204a (of FIGS. 2A and 2B) to the power distribution box. The technician powers up the power distribution box at step 1310. The technician then, at step 1312, powers up the computer boards.

A number of embodiments have been described. Nevertheless, it will be understood that various modifications may be made without departing from the spirit and scope of what is described. Accordingly, other embodiments are within the scope of the following claims.

What is claimed is:

1. A power distribution apparatus, comprising:
 a housing holding a plurality of electrical outlets;
 a plurality of separate and independent electrical circuits within the housing; and
 a plurality of cord sets, wherein each cord set of the plurality of cord sets (i) enters the housing separately from the other cord sets; and (ii) serves one of the plurality of independent electrical circuits to the exclusion of the other of the plurality of separate and independent electrical circuits.

2. The apparatus of claim 1, further comprising a plurality of electrical plugs at an exterior portion of the housing each electrical plug receiving one of the plurality of cord sets in a fixed but releasable male-female connection.

3. The apparatus of claim 1, wherein the electrical outlets are positioned in one or more substantially linear arrangements.

4. The apparatus of claim 3, wherein the electrical outlets are spaced from each other to correspond in position to motherboards in a rack-mount computer system, when the apparatus is placed vertically along an edge of a computer rack.

5. The apparatus of claim 1, further comprising a plurality of fuse sockets in the housing, wherein each fuse socket of the plurality of fuse sockets is associated with one of the independent electrical circuits.

6. The apparatus of claim 1, further comprising conductors associated with each of the independent circuits, wherein the conductors are uninsulated along a substantial length inside the housing corresponding to outlets served by the conductors.

7. The apparatus of claim 6, wherein the conductors are fixedly joined to the electrical outlets.

8. The apparatus of claim 1, wherein a first separate and independent electrical circuit serves a first plurality of contiguous electrical outlets and a second separate and independent electrical circuit serves a second plurality of contiguous electrical outlets.

9. The apparatus of claim 1, further comprising an electrical distribution box having a plurality of outlets, wherein each of the plurality of outlets is associated with one of the plurality of cord sets.

10. The apparatus of claim 9, wherein the electrical distribution box receives three-phase power and supplies single-phase power.

11. The apparatus of claim 1, wherein the plurality of cords sets is each less than about fifteen feet in length.

12. The apparatus of claim 1, wherein the housing comprises an elongated enclosure in which the plurality of electrical outlets are arranged in a substantially linear array.

13. The apparatus of claim 12, wherein the housing is mounted to a rack that is configured to support a plurality of computer boards.

14. The apparatus of claim 13, wherein the elongated enclosure defines a longitudinal axis that is oriented vertically when the enclosure is attached to the rack.

15. A power distribution apparatus, comprising:
 a plurality of electrical outlets arranged in a substantially linear array;
 a plurality of electrical circuits in a common housing, wherein each electrical circuit serves one or more of the plurality of electrical outlets and is separate from each of the other electrical circuits; and
 a plurality of cord sets, wherein each cord set is connected to one of the plurality of electrical circuits and is physically separate from each of the other cords sets outside of the common housing.

16. The apparatus of claim 15, wherein each of the plurality of cord sets serves one of the plurality of electrical circuits.

17. The apparatus of claim 15, further comprising conductors associated with each of the electrical circuits, wherein the conductors are uninsulated inside the common housing along a substantial length corresponding to outlets served by the conductors.

18. The apparatus of claim 15, wherein a first electrical circuit serves a first plurality of contiguous electrical outlets and a second electrical circuit serves a second plurality of contiguous electrical outlets.

19. The apparatus of claim 15, further comprising an electrical distribution box having a plurality of outlets, wherein each of the plurality of outlets is associated with one of the plurality of cord sets.

20. The apparatus of claim 15, wherein the common housing defines a plurality of openings in the housing arranged in a substantially linear array along a length of the housing, the housing being further arranged to receive the plurality of electrical outlets such that a plug that corresponds to the electrical outlets can be releasably coupled to one of the plurality of electrical circuits at each of the plurality of electrical outlets.

21. The apparatus of claim 20, wherein each of the plurality of electrical circuits is configured to draw a current independent of currents drawn by each of the other electrical circuits.

22. An data center electrical distribution system, comprising:
 a bus tap configured to connect to an electrical bus;
 a conductor attached at a first end to the bus tap;
 an electrical distribution box attached to a second end of the conductor; and
 a plurality of cords each extending from the electrical distribution box to one of a plurality of power strips for rack-mounted computers, wherein each cord of the plurality of cords (i) enters one of the plurality of power strips separately from the other cords; and (ii) serves one of a plurality of independent electrical circuits within the entered power strip to the exclusion of the other of the plurality of separate and independent electrical circuits within the entered power strip.

23. The system of claim 22, wherein each power strip receives three separate cords.

24. The system of claim 22, wherein the power strips are positioned along vertical front edges of data center computer racks.

25. The apparatus of claim 22, wherein the power strips are mobile relative to the electrical distribution box.

26. A data center electrical distribution system, comprising:
 an electrical bus bar;
 a first plurality of electrical distribution boxes electrically connected to the bus bar, each of the first plurality of electrical distribution boxes including a plurality of outlets connecting a plurality of cord sets to a plurality of power strips for powering computer units, wherein each cord set of the plurality of cord sets (i) enters one of the plurality of power strips separately from the other cord sets; and (ii) serves one of a plurality of independent electrical circuits within the entered power strip to the exclusion of the other of the plurality of separate and independent electrical circuits within the entered power strip; and
 a second plurality of electrical distribution boxes electrically connected to the bus bar, each of the second plurality of electrical distribution boxes including a plurality of outlets for connecting to cord sets for powering mechanical services associated with the computer units.

27. A method of establishing an electrical distribution array, comprising:
 electrically connecting a plurality of rack-mounted computers to a rack-mounted power strip having a plurality of input power cords, wherein each input power cord of the plurality of input cords (i) enters the power strip separately from the other cords; and (ii) serves one of a plurality of independent electrical circuits within the power strip to the exclusion of the other of the plurality of separate and independent electrical circuits within the power strip;
 positioning a rack holding the rack-mounted computers near an electrical distribution box;
 electrically connecting the plurality of input power cords to the electrical distribution box; and
 powering the electrical distribution box.

\* \* \* \* \*